US012765124B2

(12) United States Patent
Altazin et al.

(10) Patent No.: US 12,765,124 B2
(45) Date of Patent: Oct. 13, 2026

(54) METHOD FOR MANUFACTURING MICRO-LEDs

(71) Applicant: Commissariat à l'énergie atomique et aux énergies alternatives, Paris (FR)

(72) Inventors: Stéphane Altazin, Grenoble (FR); Paolo De Martino, Grenoble (FR); Nicolas Michit, Grenoble (FR); Carole Pernel, Grenoble (FR); Julia Simon, Grenoble (FR); François Levy, Grenoble (FR); Bernard Aventurier, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 397 days.

(21) Appl. No.: 18/541,109

(22) Filed: Dec. 15, 2023

(65) Prior Publication Data

US 2024/0213409 A1 Jun. 27, 2024

(30) Foreign Application Priority Data

Dec. 21, 2022 (FR) .................................... 22 14156

(51) Int. Cl.
*H01L 33/32* (2010.01)
*H01L 25/075* (2006.01)
(Continued)

(52) U.S. Cl.
CPC .... *H10H 20/825* (2025.01); *H10H 20/01335* (2025.01); *H10H 20/819* (2025.01);
(Continued)

(58) Field of Classification Search
CPC ........... H10H 20/825; H10H 20/01335; H10H 20/819; H10H 20/8312; H10H 20/833;
(Continued)

(56) References Cited

U.S. PATENT DOCUMENTS

2015/0303655 A1* 10/2015 Han .................... H01S 5/34333 438/32
2020/0251460 A1 8/2020 Iguchi
(Continued)

FOREIGN PATENT DOCUMENTS

GB 2592017 A 8/2021
WO WO 2021/233917 A1 11/2021

OTHER PUBLICATIONS

French Preliminary Search Report and Written Opinion issued Sep. 18, 2023 in French Application 22 14156 filed on Dec. 21, 2022 citing documents 1-3, 15-16 therein, 16 pages (with English Translation of Categories of Cited Documents).

*Primary Examiner* — Tong-Ho Kim

(74) *Attorney, Agent, or Firm* — Oblon, McClelland, Maier & Neustadt, L.L.P.

(57) ABSTRACT

A method for manufacturing micro-LEDs may include: (i) providing a stack including at least one strongly n-doped GaN layer, an n-doped GaN layer, quantum wells, and a p-doped GaN layer; (ii) porosifying the GaN layer, to obtain a porosified GaN layer; (iii) forming mesas in the stack; (iv) covering the porosified GaN layer with a second electrode or with an encapsulation layer, the second electrode or the encapsulation layer being in direct contact with the porosified GaN layer. The porosifying (ii) may be carried out so that the optical index of the porosified GaN layer does not vary by more than 10% with respect to the optical index of the second electrode and/or with respect to the optical index of the encapsulation layer.

25 Claims, 13 Drawing Sheets

(51) Int. Cl.

| | |
|---|---|
| ***H01L 33/00*** | (2010.01) |
| ***H01L 33/20*** | (2010.01) |
| ***H01L 33/38*** | (2010.01) |
| ***H01L 33/42*** | (2010.01) |
| ***H10H 20/01*** | (2025.01) |
| ***H10H 20/819*** | (2025.01) |
| ***H10H 20/825*** | (2025.01) |
| ***H10H 20/831*** | (2025.01) |
| ***H10H 20/833*** | (2025.01) |
| ***H10W 90/00*** | (2026.01) |

(52) U.S. Cl.
CPC ...... *H10H 20/8312* (2025.01); *H10H 20/833* (2025.01); *H10W 90/00* (2026.01); *H10H 20/032* (2025.01)

(58) Field of Classification Search
CPC .. H10H 20/032; H10H 20/84; H10H 20/8314; H10H 20/817; H10H 20/818; H10H 20/018; H10H 20/854; H10H 29/142; H10W 90/00
USPC ........................................................... 257/79
See application file for complete search history.

(56) References Cited

U.S. PATENT DOCUMENTS

2023/0085036 A1 3/2023 Mezouari et al.
2023/0187421 A1* 6/2023 Pinos .................. H10H 29/142 257/79
2023/0317892 A1* 10/2023 Mezouari ............. H10H 20/841 257/79

* cited by examiner

METHOD FOR MANUFACTURING MICRO-LEDs

CROSS-REFERENCE TO RELATED APPLICATIONS

The present application is claims the benefit of the filing date of French Appl. No. 22 14156, filed on Dec. 21, 2022, the content of which is incorporated by reference.

TECHNICAL FIELD

The present invention relates to the general field of colour micro-displays. The invention relates to a method for manufacturing micro-LEDs. The invention also relates to a structure thus obtained. The invention is particularly interesting because it allows improving the emission uniformity and repeatability of micro-displays based on micro-LEDs, in particular GaN-type micro-LEDs. The invention finds applications in numerous industrial fields, and in particular in the field of colour micro-displays based on micro-LEDs.

PRIOR ART

Colour micro-displays comprise pixels formed by blue, green and red subpixels (RGB pixels). In the remainder of the description, these subpixels will be referred to more simply as pixel for conciseness.

The blue and green pixels may be manufactured from nitride materials and the red pixels from phosphide materials. Red pixels may also be obtained from nitride materials, for example, by growth over a substrate including porous GaN.

A micro-display of GaN-based light-emitting diodes (LED) includes an array of unitary micro-LEDs on a substrate comprising a CMOS circuit. One LED corresponds to one pixel. Each LED is connected to the CMOS circuit.

According to a conventional manufacturing method, a GaN epitaxy and an upper anode may be pixelated directly over the growth substrate (made of sapphire or of Si), an electrode (cathode) may be deposited (with or without contact with the n-GaN), then metal pads added by the microelectronics means to enable a transfer with interconnection of the substrate containing the pixels onto the CMOS control circuit. Removing the growth substrate and thinning the GaN allows adding electrical functions at the rear face (contact with the n-GaN if not carried out at the front face), as well as limiting the cross-talk between the pixels and adding optical functions on the light emission side (for example in the upper passivation layers).

Another method for manufacturing micro-LEDs consists in bonding a GaN epitaxy and an anode which are not pixelated directly over a silicon plate containing the CMOS circuit. Bonding is a metal bonding enabling the conduction of the electrical current (eutectic or direct bonding). Then, this CMOS circuit and GaN epitaxy set is thinned in order to be able to subsequently use conventional microelectronics processes. Afterwards, the epitaxy as well as the bonding layer are pixelated in order to individualise the micro-LEDs of the micro-display array. Each of the micro-LEDs could then be addressed by the CMOS circuit.

An upper electrode (cathode) enables contact between the n-GaN either by lateral contact with the n-GaN (for example made of aluminium) or by contact above the n-GaN layer with a conductive transparent layer, for example, made of indium-tin oxide (ITO). The optical index of this ITO layer is comprised between 1.9 and 2.1. Afterwards, an encapsulation layer is deposited above the GaN. The encapsulation layer is conventionally made based on SiN whose optical index is also comprised between 1.9 and 2.1. In turn, the optical index of GaN is about 2.4.

However, in these two previously-described methods for manufacturing arrays of micro-LEDs, a variation in the thickness (TTV: "total thickness variation") of the GaN is introduced, not only at the wafer level but also wafer-by-wafer. These thickness variations result from both the thickness variations of the epitaxy but especially from the thinning processes or planarisation processes used in order to pull off the buffer layers of the epitaxy which have a thickness of several microns, because of the non-uniformities of the used processes. Yet, these thickness variations could result in a variation in the optical performances of the LED (luminance, angular emission, spectrum, etc.), in particular when the anode is a mirror, and the LED thus formed is of the resonant cavity type (emissive source in a Fabry-Perot resonator). A modification of the thickness of the GaN will modify the optical cavity formed between the anode, the GaN and the upper optical interface (ITO/SiN in the previous example), which modifies extraction (into SiN in the example) and consequently extraction in air.

In the case where micro-lens or meta-surface type devices are structured in the upper encapsulation layer in order to maximise the light extraction and/or in order to deflect the optical flux in a specific direction, the uniformity of the emission in this passivation layer is even greater.

Indeed, the efficiency of these devices depends on the angular emission in the passivation layer.

In the case where the encapsulation layer is not structured, the uniformity of the emission in air (or the control of the extraction in air) may be improved by introducing an anti-reflective layer at the passivation layer/air interface or by depositing a passivation layer with a large thickness (typically about ~1 μm).

The addition of the anti-reflector over the encapsulation layer avoids a return of light back to the stack.

However, even with an anti-reflective layer, the uniformity of the emission in air will be good only if the emission in the encapsulation layer is uniform.

The uniformity of the emission in the SiN may be obtained by widening the emission spectrum of the LED (but this is not what is desired for this device type) or by thickening the n-GaN but this also tends to reduce the EQE.

However, this adds steps to the method or cannot be compatible with all devices which are increasingly miniaturised.

Indeed, the addition of thick layers will introduce optical interference phenomena ("cross talk") (also referred to as optical crosstalk) between the pixels in miniaturised devices, by lateral guidance of the light in the dielectrics.

In parallel, studies on the n-GaN porosification are conducted. For example, it has been shown in the article by Lin et al. ('*InGaN resonant microcavity with $n^+$-porous-GaN/$p^+$-GaN tunnelling junction*' (IEEE Elec. Dev. Lett, vol. 42, NO. 11, 2021) or in the article by Mishkat-Ul-Masabih et al. ('*Electrically injected nonpolar GaN-based VCSELs with lattice-matched nanoporous distributed Bragg Reflector mirrors*', Appl. Phys. Express 12, 036504, 2019) that it is possible to manufacture a resonant-cavity LED by positioning conductive Bragg mirrors based on porous GaN at the top and at the bottom of the structure. The porosification allows modifying the optical index of the GaN and improving the light-emitting properties of the resonant-cavity LED, in particular by obtaining Bragg mirrors with high reflectivity on either side of the optical cavity, but also a perfect control of the optical cavity thickness (1λ for example).

However, this method is hardly usable in the case of arrays of miniaturised LEDs. The thickness of the Bragg mirrors reaches several μm, which poses a form factor problem for the microelectronics integration process. Thus, the described devices have a side of several tens of micrometres. In addition, the epitaxed stack is particularly complex (because it contains an alternation of strongly doped and less doped layers), and induces an increase in the resistivity of the μLEDs (porous n-GaN generally being less conductive than non-porous n-GaN).

DISCLOSURE OF THE INVENTION

The present invention aims to provide a method overcoming the drawbacks of the prior art, and in particular allowing manufacturing a micro-LED having a uniform and repeatable emission despite the process variations.

For this purpose, the present invention provides a method for manufacturing micro-LEDs comprising at least the following steps:

i) providing a stack comprising at least one strongly n-doped GaN layer, an n-doped GaN layer, quantum wells and a p-doped GaN layer and a first electrode, ii) porosifying the strongly n-doped GaN layer, whereby a porosified GaN layer is obtained, iii) forming mesas in the stack, iv) covering the porosified GaN layer with a second electrode formed by a conductive transparent oxide layer, the second electrode being in direct contact with the porosified GaN layer, then, preferably, covering the second electrode with an encapsulation layer, or depositing a second electrode over a lateral face of the porosified GaN layer or over a lateral face of the n-doped GaN layer and covering the porosified GaN layer with an encapsulation layer, the encapsulation layer being in direct contact with the porosified GaN layer.

Steps ii) and iii) could be carried out in the order ii) and iii) or in the order iii) and ii).

Step ii) being carried out so that the optical index of the porosified GaN layer does not vary by more than 10% with respect to the optical index of the second electrode and/or with respect to the optical index of the encapsulation layer. Preferably, it does not vary by more than 5%, and even more preferably it does not vary by more than 2%, with respect to the optical index of the second electrode and/or of the encapsulation layer.

The optical index $n_{eff}$ of the porosified GaN layer depends on the volumetric concentration of the pores in the layer. It will be selected according to the materials of the conductive transparent oxide layer and/or of the encapsulation layer. The pore volumetric concentration may be determined based on the following approximate formula:

$$n_{eff} = \sqrt{(1-p)\cdot n_{GaN}^2 + p\cdot n_{air}^2}$$

with p the pore volumetric concentration, $n_{GaN}$ the optical index of the non-porosified GaN, and $n_{air}$ the optical index of air.

For example, in order to obtain an effective index $n_{eff}$ of 1.9, a pore concentration in the range of 45% will be selected.

Advantageously, the conductive transparent oxide layer is an indium-tin oxide layer and/or the encapsulation layer is made of SiN, $SiO_2$ or SiON. Advantageously, the encapsulation layer has an optical index close to that of ITO. Preferably, the encapsulation layer is made of SiN.

The invention fundamentally differs from the prior art by the presence of a porosified GaN layer beneath and in contact with the conductive transparent oxide layer or by the presence of a porosified GaN layer beneath and in contact with the encapsulation layer.

The optical index of the GaN is modified by the porosification. The porosification is conducted such that the optical index of the porosified GaN layer is close to:

the optical index of the conductive transparent oxides (TCO), in particular of the ITO, and/or the optical index of the encapsulation layers, for example made of SiN, in particular, in the case where the upper electrode (for example made of aluminium) covers the sidewalls of the porosified layer and where the porosified layer is in direct contact with the encapsulation layer.

Since the indices of the porosified layer, of the TCO layer and of the encapsulation layer are close, reflections at these interfaces are minimised, making emission in the SiN independent of the variations in the thickness of the porous GaN.

Advantageously, the porous GaN layer has a porosity between 40% and 70% by volume so as to have an effective optical index close to 1.9 (i.e. close to the optical index of the upper layers) and thus minimise reflections between the porous GaN and these upper layers.

The porous GaN layer being arranged between the anode (lower electrode) and the cathode (upper electrode, herein the conductive transparent oxide layer), the porosity will not be too high so that this porosified layer could transport electrons. To preserve a conductive porous layer, it is possible to implement a localised differential doping of the n-GaN layer in order to preserve a non-porosified area at the pixel level.

The fine localisation of the GaN/porous GaN interface allows controlling the thickness of the cavity of the LED and thus positioning the reflection interface between the GaN and the porous GaN at a constructive interference position in order to maximise the light extraction. Thus, it is possible to reduce the thicknesses of the micro-LEDs by the pattern ("design") of the epitaxy, by compacting as much as possible the p-GaN stack, the quantum wells and n-GaN to its minimum, advantageously between 250 and 500 nm, in order to maximise coupling of the optical power in the vertical mode rather than in the plane-guided modes. The extraction gains as well as the emission uniformity gains will be even greater as the GaN thickness is small.

Preferably, the GaN layers are formed by epitaxy.

The porosification is carried out by electrochemical anodisation. The electrochemical porosification has a selectivity according to the doping level. It acts only in the most n-doped areas ($10^{19}$ at·cm$^{-3}$ for example), defined in particular during epitaxy. The position of the porous areas is then finely controlled. Thus, the non-porosified GaN thickness will be constant irrespective of the thickness variations resulting from the method. The variations, introduced by the method for manufacturing the micro-LED, are transferred into the porous layer which allows absorbing the process variations. The porous layer is an optical extraction layer which is tolerant to thickness variations.

The pixelation may be done before or after transfer, the growth substrate should be removed, at least if it is opaque (case of Si).

Advantageously, the thickness of the strongly doped GaN layer is comprised between 100 nm and 500 nm, preferably between 200 and 500 nm. Thus, the GaN thickness is larger than the TTV introduced by the epitaxy and by the thinning processes (in the range of 200 nm).

An anti-reflective layer may be deposited over the encapsulation layer.

According to a first advantageous embodiment, the method is a method for making micro-LEDs by monolithic bonding of the epitaxy.

According to a variant of this first embodiment, step i) is advantageously carried out according to the following steps a) to c):

a) providing an initial stack comprising a support layer, possibly a buffer layer made of (Al,Ga)N, a non-intentionally doped GaN layer, the strongly n-doped GaN layer, the n-doped GaN layer, the quantum wells, the p-doped GaN layer and the first electrode,
b) transferring the initial stack onto a support substrate covered with a metal layer,
c) removing the support layer, where appropriate the buffer layer made of (Al,Ga)N, the non-intentionally doped GaN layer, for example by thinning, whereby a substrate of interest comprising the support substrate, the first electrode, the p-doped GaN layer, the quantum wells made of GaN/InGaN, the n-doped GaN layer and the strongly n-doped GaN layer is obtained.

According to another variant of this first advantageous embodiment, the method may comprise, before step ii), a step during which the doping level of the strongly n-doped GaN layer is locally reduced, for example by implantation of helium or hydrogen ions, so as to have a first portion of the strongly n-doped GaN layer having a first conductivity and a second portion of the strongly doped GaN layer having a second conductivity, the first electrical conductivity being higher at least by a ten factor than the second electrical conductivity, whereby:

- the second portion is not porosified during step ii),
- the porosified GaN layer of the mesas obtained in step iii) comprises a non-porosified portion and a porosified portion, the non-porosified portion being preferably at the centre of the porosified portion.

Thus, the doped GaN layer comprises doped areas and weakly doped areas, the weakly doped areas not being porosified during step ii). The doped GaN layer of the mesas obtained in step iii) comprises a non-porosified central portion and a porosified boundary.

Still according to this first advantageous embodiment, the method may comprise the following steps:

- the method comprises an additional step between step i) and step ii) during which the strongly n-doped GaN layer and a portion of the n-doped GaN layer are etched to form a pre-structure of mesas,
- during step ii), the central portion of the strongly n-doped GaN layer is not porosified, for example by stopping the porosification step before total porosification of the strongly doped GaN layer, whereby the GaN layer of the mesas obtained in step iii) comprises a non-porosified central portion and a porosified boundary,
- step iii) is carried out by etching the other portion of the n-doped GaN layer, the quantum wells, the p-doped GaN layer, the first electrode and a portion of the support substrate.

In these two variants, the injection is improved because only the periphery of the GaN layer is porosified. The non-porosified area at the centre of the pixel may be used for contact resumption.

According to a second advantageous embodiment, the method is a method for making micro-LEDs by chip flipping or hybrid bonding.

According to this second embodiment, the method may comprise the following successive steps:

i) providing a stack comprising a support layer, a non-intentionally doped GaN layer, a strongly n-doped GaN layer, an n-doped GaN layer, quantum wells, a p-doped GaN layer and a first electrode,
iii) forming mesas in the stack, by etching the first electrode, the p-doped GaN layer, the quantum wells, the n-doped GaN layer, the strongly n-doped GaN layer and a portion of the non-intentionally doped GaN layer,
   - implementing step ii) to porosify the strongly n-doped GaN layer, whereby a porosified GaN layer is obtained,
   - transferring the obtained stack onto a support substrate covered with a metal layer,
   - removing the support layer, the non-intentionally doped GaN layer, for example by thinning whereby a substrate of interest comprising the support substrate, the first electrode, the p-doped GaN layer, the quantum wells made of GaN/InGaN, the n-doped GaN layer and the strongly n-doped GaN layer is obtained,
   - implementing step iv).

Advantageously, the method further comprises at least one of the following steps:

- depositing an anti-reflective layer is deposited over the encapsulation layer,
- structuring the encapsulation layer by micro-lenses or meta-surfaces to maximise the light extraction and/or deflect the optical flux in a specific direction.

The method may further comprise a step of depositing a dielectric over the sidewall of the mesas acting as a passivation layer of the defects created during etching of the mesas as well as the deposition of an electrically- and heat-conductive element, for example copper-based, in the space between the mesas, thereby creating the second metal electrode (cathode) which will be in contact with the N contact deposit made of ITO or using the lateral contact.

It is possible to reduce the thicknesses of the micro-LEDs, because the extraction gains as well as the emission stability gains will be even greater as the GaN thickness is small.

The invention also relates to a micro-LED structure obtained according to the previously-described method.

A micro-LED structure comprising a stack, the stack comprising at least one porosified strongly n-doped GaN layer, an n-doped GaN layer, quantum wells, a p-doped GaN layer and a first electrode, mesas being formed in the stack,

- the porosified GaN layer being covered and in direct contact with a second electrode formed by a conductive transparent oxide layer, the second electrode being preferably covered with an encapsulation layer,
- or
- a second electrode being arranged over a lateral face of the porosified GaN layer or over a lateral face of the n-doped GaN layer, the porosified GaN layer being covered and in direct contact with an encapsulation layer,
- in any case, the optical index of the porosified GaN layer not varying by more than 10% with respect to the optical index of the second electrode and/or with respect to the optical index of the encapsulation layer.

For example, the structure comprises a substrate of interest, the substrate of interest comprising a support substrate, a first electrode, a p-doped GaN layer, GaN/InGaN quantum wells, an n-doped GaN layer, a strongly doped GaN layer, mesas being formed in the substrate of interest. The mesas comprising the porosified strongly doped GaN layer, the doped GaN layer, the quantum wells, the p-doped GaN layer, the lower electrode and a portion of the support substrate. The mesas are covered with a second electrode formed by a conductive transparent oxide layer, preferably an indium-tin oxide layer, and/or with an encapsulation layer.

Advantageously, the strongly doped GaN layer of the mesas comprises a non-porosified central portion and a porosified boundary.

According to a first advantageous variant, the central portion is weakly doped.

According to a second advantageous variant, the central portion is strongly doped.

Advantageously, the porosified GaN layer has a thickness comprised between 100 and 500 nm, preferably between 300 and 500 nm.

Other features and advantages of the invention will appear from the following complementary description.

It goes without saying that this complementary description is given only as an illustration of the object of the invention and should in any event be interpreted as a limitation of this object.

BRIEF DESCRIPTION OF THE DRAWINGS

The present invention will be better understood upon reading the description of embodiments given for merely indicative and non-limiting purposes with reference to the appended drawings, wherein.

DETAILED DISCLOSURE OF PARTICULAR EMBODIMENTS

The different parts shown in the figures are not necessarily plotted according to a uniform scale, to make the figures more readable.

The different possibilities (variants and embodiments) should be understood as not being mutually exclusive and can be combined with one another.

Furthermore, in the description hereinafter, terms that depend on the orientation, such as "top", "bottom", etc., of a structure apply while considering that the structure is oriented as illustrated in the figures.

Although this is in no way limiting, the invention finds applications in particular in the field of monochromatic micro-displays or colour micro-displays, and more particularly for LED manufacturing. However, it could be used in the photovoltaic or water electrolysis ("water splitting") field since, firstly, InGaN absorbs throughout the visible spectrum and, secondly, its valence and conduction bands are around the water stability domain, the thermodynamic condition necessary for the water decomposition reaction. The invention may also be interesting for the manufacture of lasers emitting at long wavelengths.

The invention is described more particularly for monolithic-type integration by complete transfer of the layers, i.e. the porosification step is carried out after transfer (FIGS. 1A to 1F, 2A to 2G and 3A to 3G).

However, it is also possible to carry out the porosification step on the growth substrate, manufacture the LED then perform a flip-chip type assembly or hybrid bonding on a substrate comprising an "ASIC"-type integrated circuit ("Application-Specific Integrated Circuit"). The porosification step is carried out after transfer, which allows achieving a relief during the growth (FIGS. 4A to 4J).

The method is particularly interesting for manufacturing structures comprising porosified (Al,In,Ga)N/(Al,In,Ga)N mesas having in particular a pitch of less than 30 μm.

By (Al,In,Ga)N, it should be understood AlN, AlGaN, InGaN or GaN. Next, reference is made more particularly to porous GaN, but it is possible to have, for example, porous InGaN or AlGaN.

We will describe in more detail the micro-LED manufacturing method with reference to the appended FIGS. 1A-1F, 2A-2G and 3A-3G.

Figure 1A:
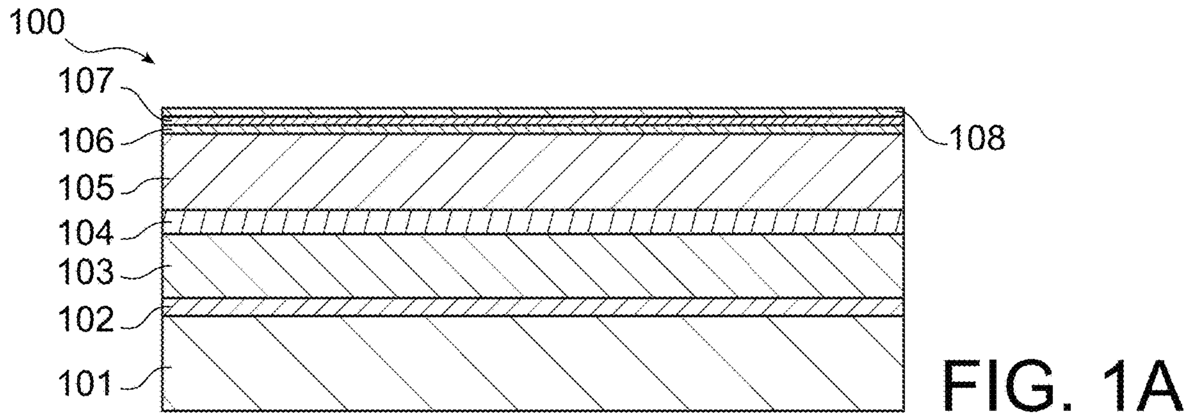
FIGS. 1A to 1F schematically show different steps of a method for manufacturing micro-LEDs according to a particular embodiment of the invention.
Figure 1B:
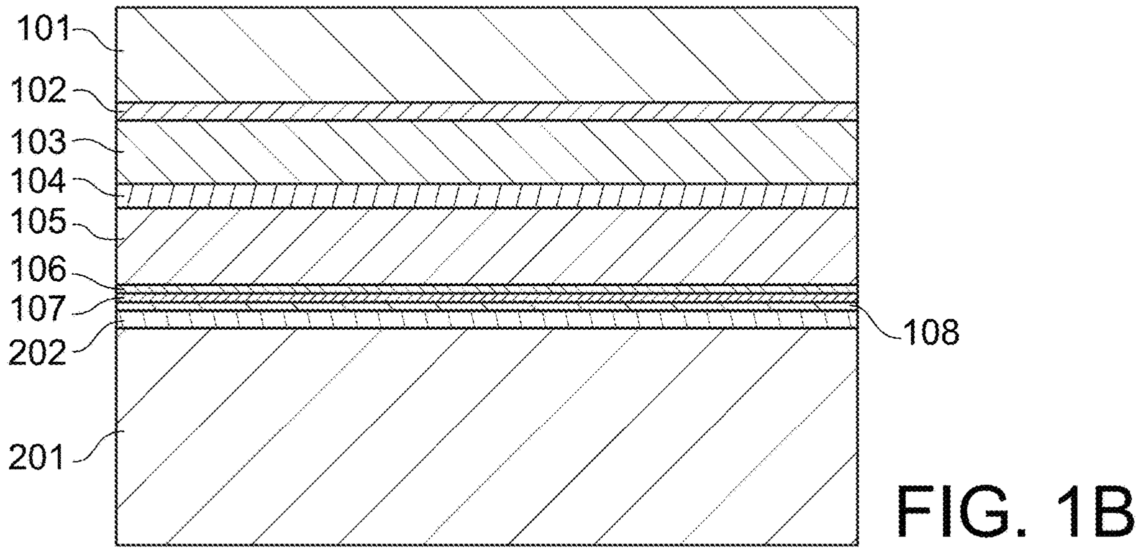
Figure 1C:
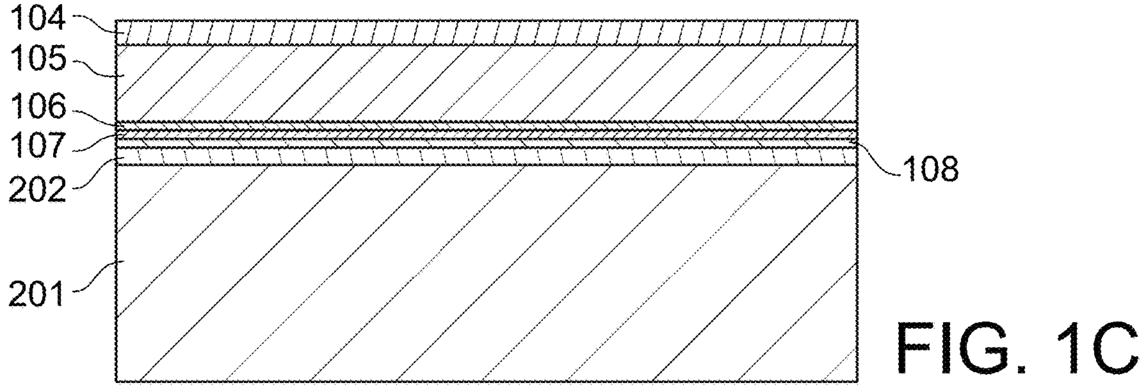
Figure 1D:
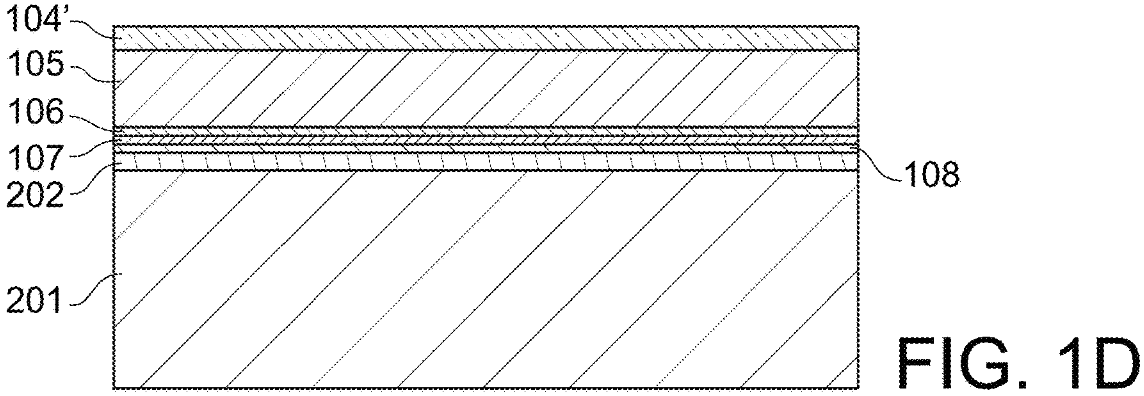
Figure 1E:
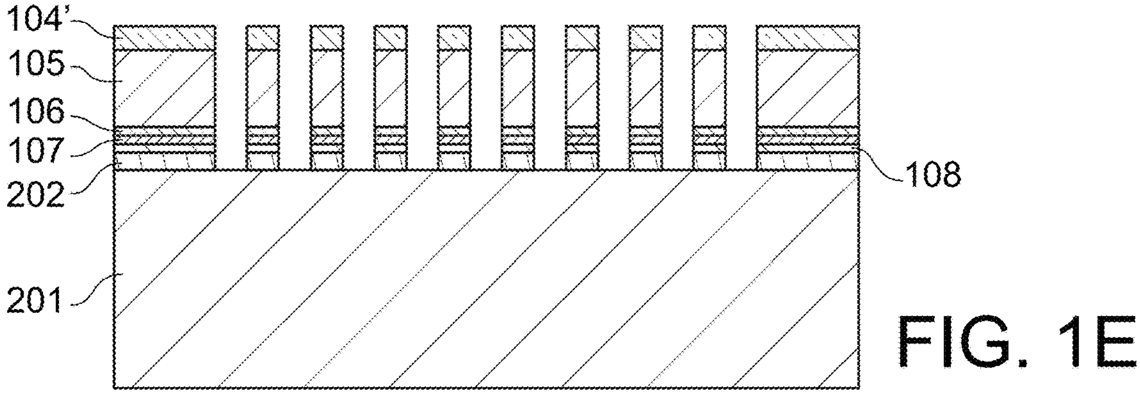
Figure 1F:
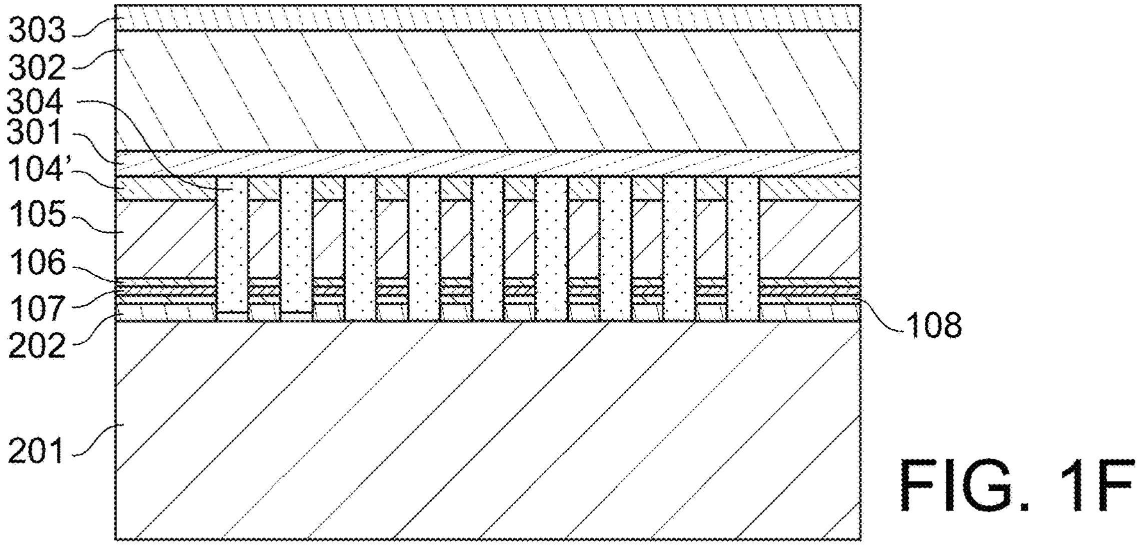
Figure 2A:
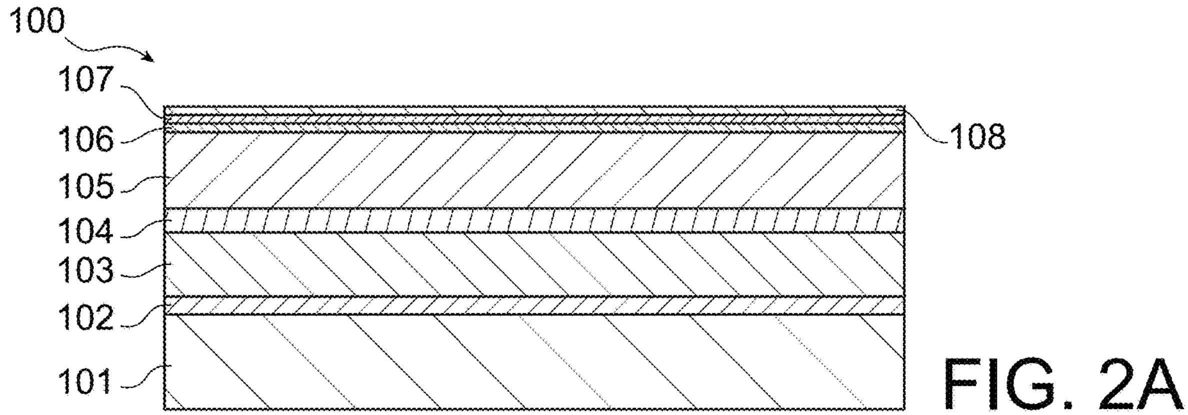
FIGS. 2A to 2G schematically show different steps of a method for manufacturing micro-LEDs according to another particular embodiment of the invention.
Figure 2B:
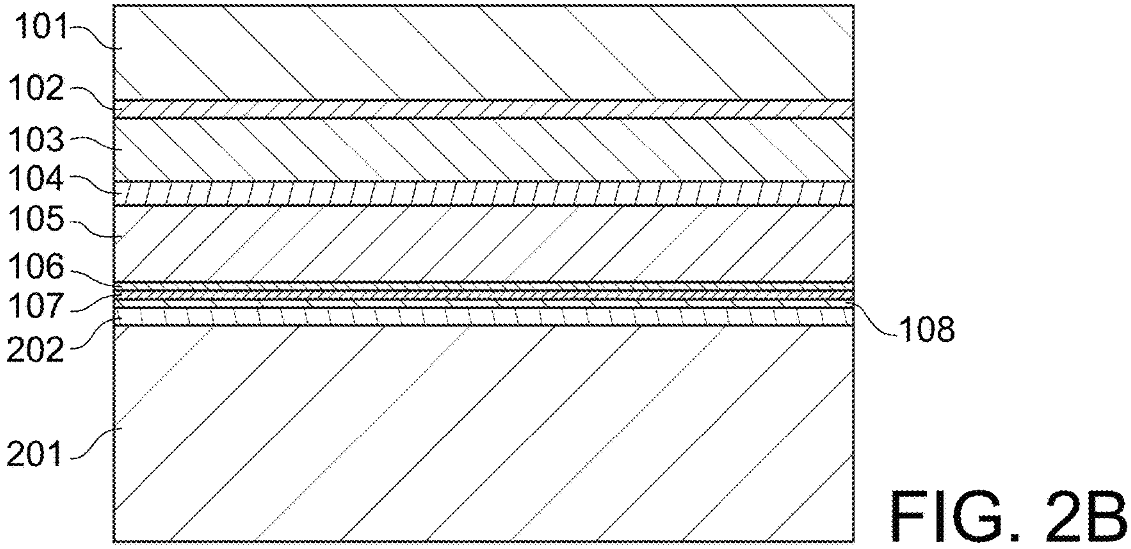
Figure 2C:
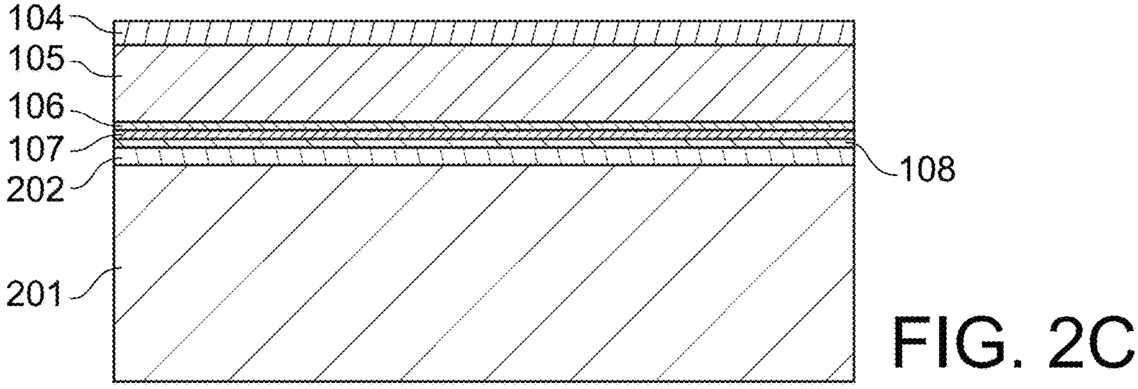
Figure 2D:
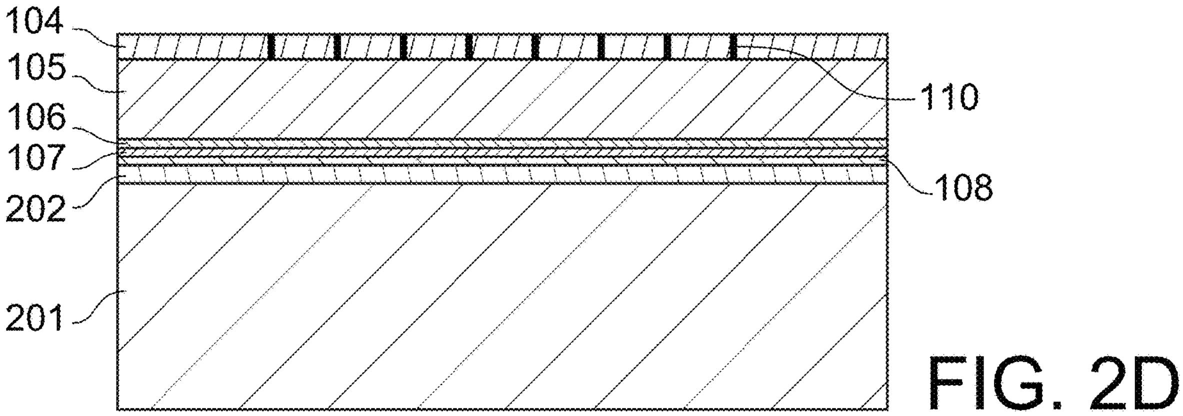
Figure 2E:
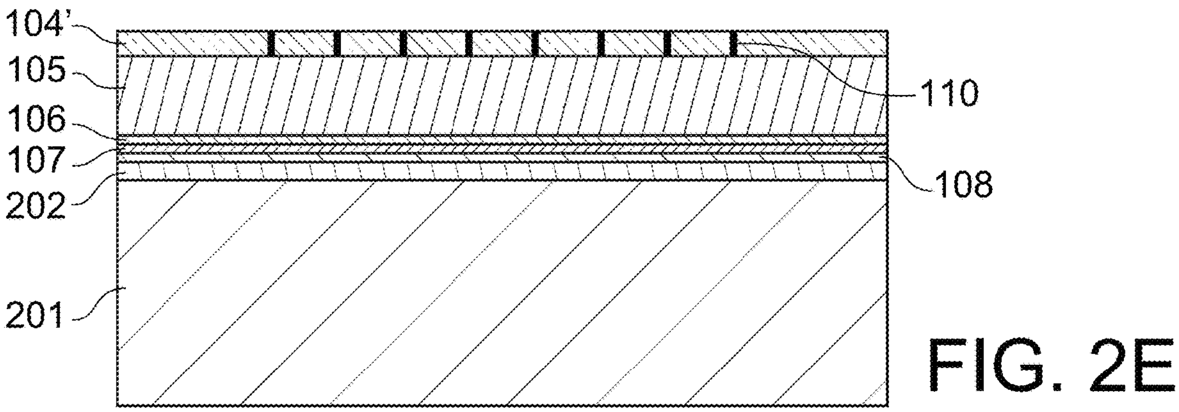
Figure 2F:
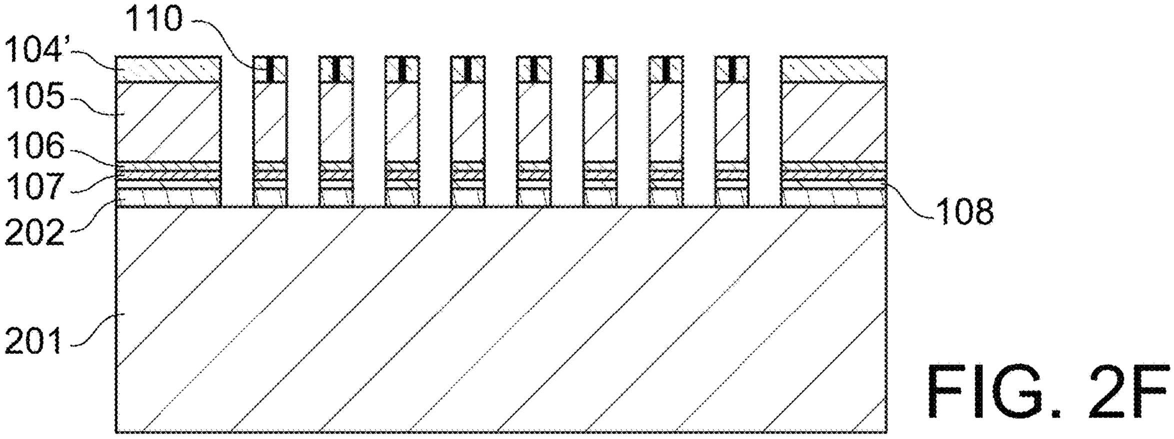
Figure 2G:
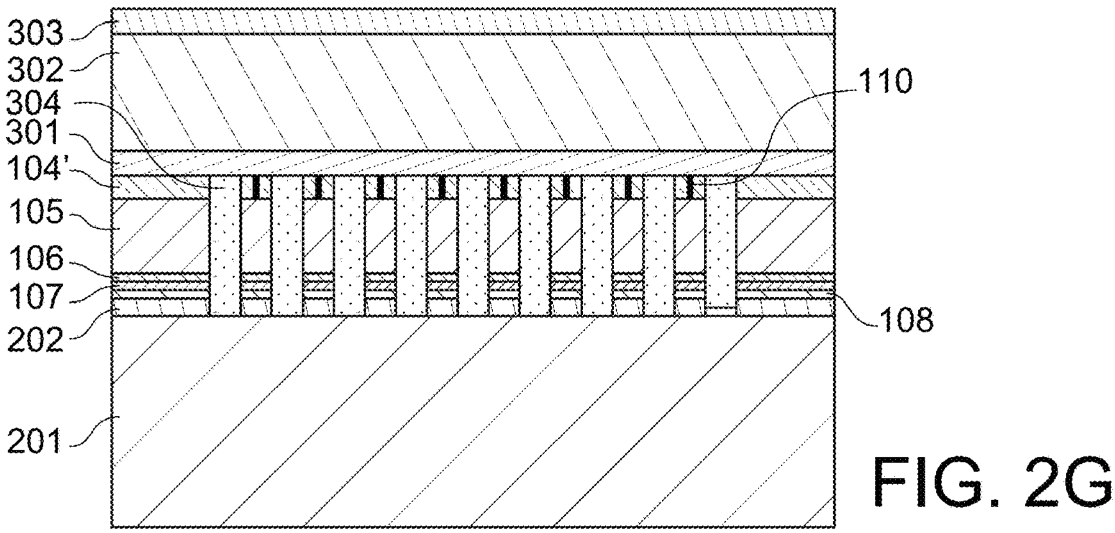
Figure 3A:
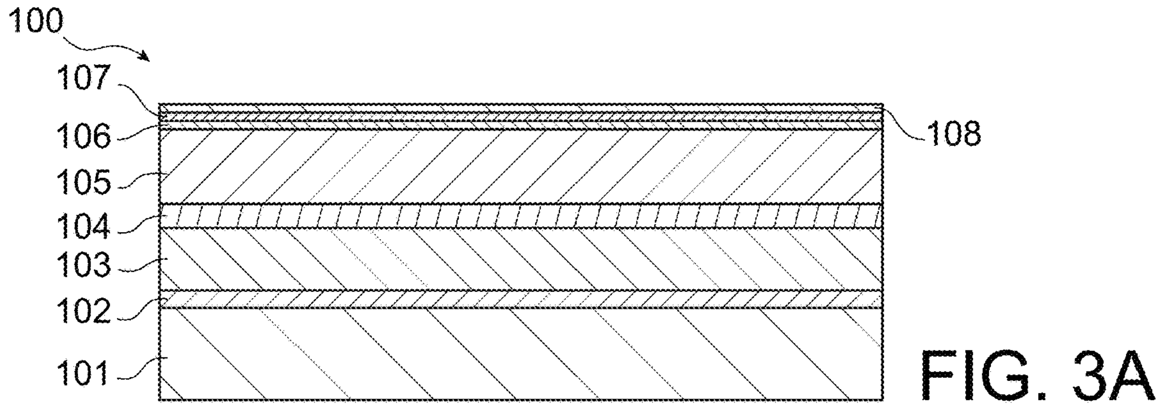
FIGS. 3A to 3G schematically show different steps of a method for manufacturing micro-LEDs according to another particular embodiment of the invention.
Figure 3B:
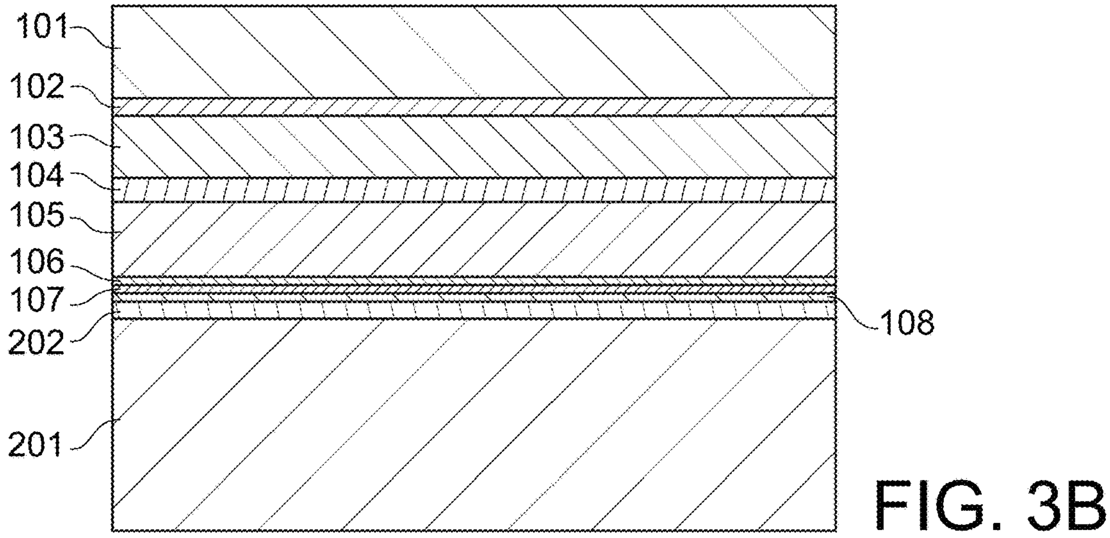
Figure 3C:
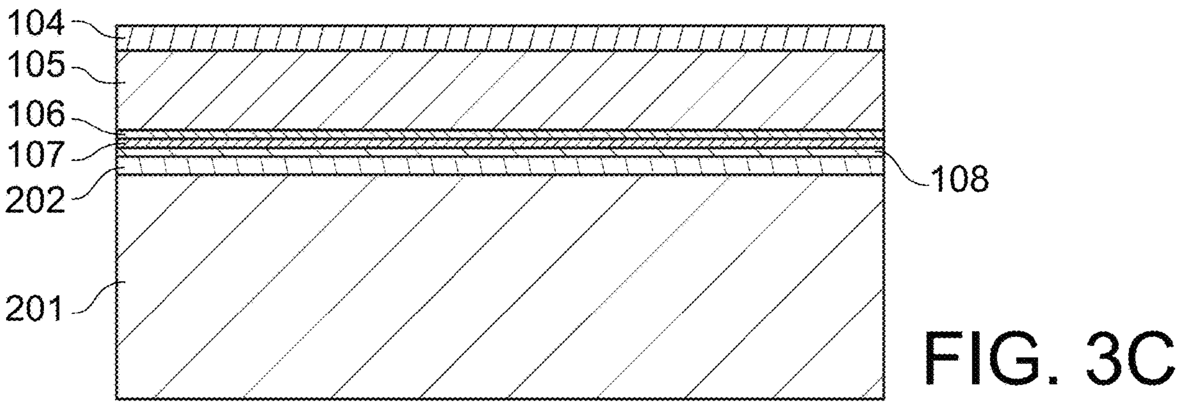
Figure 3D:
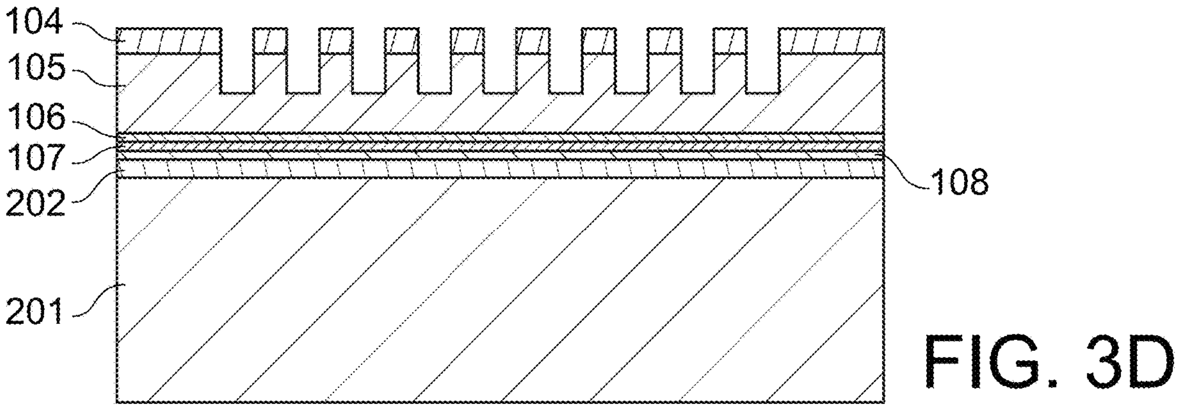
Figure 3E:
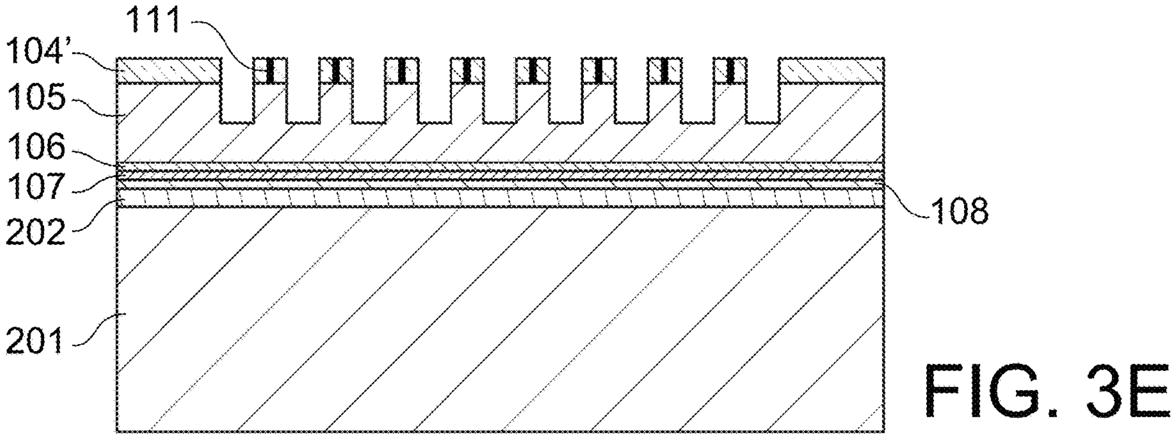
Figure 3F:
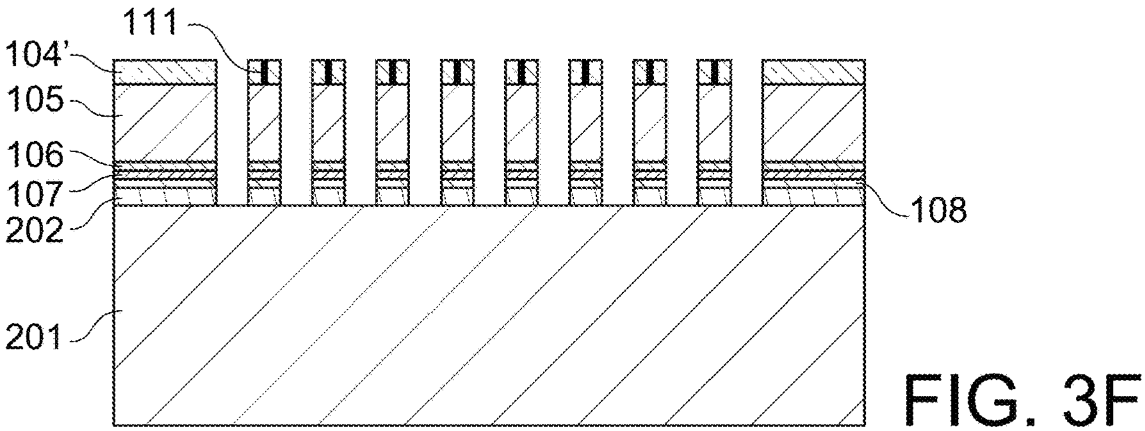
Figure 3G:
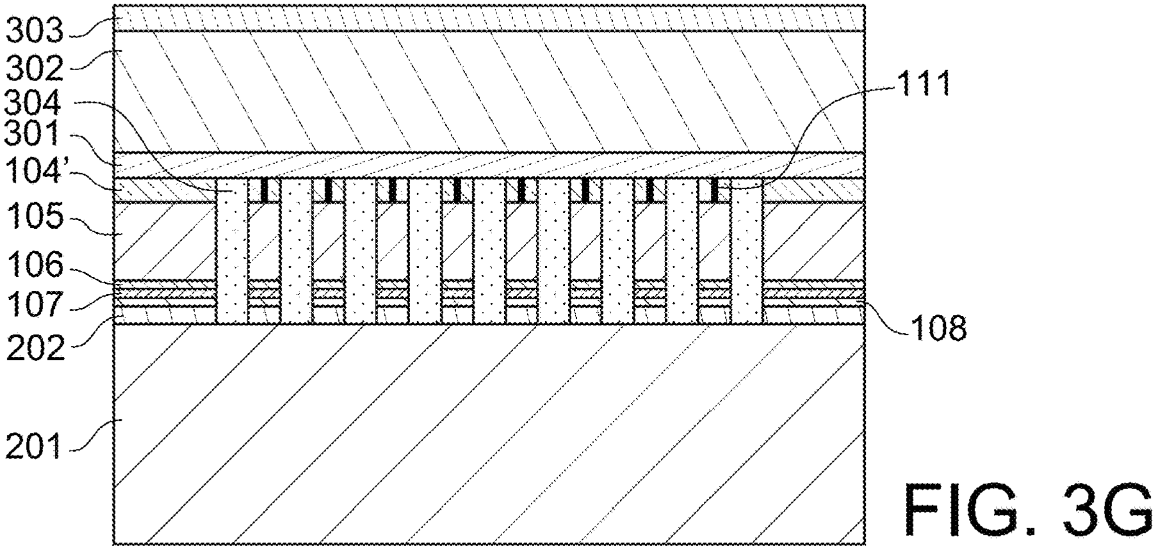

The micro-LED manufacturing method comprises the following steps:

a) providing a first stack 100 comprising (FIGS. 1A, 2A, 3A):
   - a base substrate 101,
   - possibly a buffer layer 102, for example made of AlGaN,
   - a layer 103 made of non-intentionally doped GaN (nid GaN),
   - a strongly n-doped GaN layer 104 ($n^+$-GaN), having a first electrical conductivity,
   - an n-doped GaN layer 105 (n-GaN),
   - quantum wells 106 made of Gan/InGaN,
   - a p-doped GaN layer 107 (p-GaN),
   - a first electrode 108 (or lower electrode), preferably metallic, b) transferring the first stack 100 onto a support substrate 201, covered with an electrically-conductive layer 202, preferably a metal layer (FIGS. 1B, 2B, 3B), the metal layer 202 interconnected with the first electrode 108 during transfer, preferably carried out by metal-metal bonding, c) removing the base substrate 101, then removing the buffer layer 102 where appropriate and the layer 103 made of nid-GaN, for example by thinning, whereby a substrate of interest comprising the support substrate 201, the lower electrode 202, the p-doped GaN layer 107, the quantum wells 106 made of GaN/InGaN, the n-doped GaN layer 105, the strongly n-doped GaN layer 104 is obtained (FIGS. 1C, 2C, 3C), d) partially or totally porosifying the strongly n-doped GaN layer 104, whereby a porosified GaN layer 104' is obtained (FIGS. 1D, 2E, 3E), e) forming mesas in the substrate of interest, the mesas comprising the porosified GaN layer 104', the doped GaN layer 105, the quantum wells 106, the p-doped GaN layer 107, the lower electrode 108 and a portion of the support substrate 201 (FIGS. 1E, 2F, 3F).

According to a first alternative, the method may further comprise the following steps:

f) covering the mesas (i.e. covering the upper face of the porosified layer 104') with a second electrode 301 (or upper electrode) formed for example by a conductive transparent oxide layer, preferably an indium-tin oxide layer (FIGS. 1F, 2G, 3G), g) possibly, depositing an encapsulation layer 302 over the second electrode 301, h) possibly, depositing an anti-reflective layer 303 over the encapsulation layer 302.

According to another alternative, the method may further comprise the following steps:

f') forming a second electrode 301 (or upper electrode) for example a conductive transparent oxide layer, or an aluminium layer over a lateral face of the mesas (i.e. over a lateral face of the porosified layer 104' and/or over a lateral face of the layer 105), g') covering the mesas (i.e. covering the upper face of the porosified layer 104') with an encapsulation layer 302, h') possibly, depositing an anti-reflective layer 303 over the encapsulation layer 302.

Thus, the contact of the second electrode 301 may be made on the upper face of the porosified GaN layer 104', on the lateral face of the porosified GaN layer 104' or on the lateral face of the doped GaN layer 105.

The upper face of the porosified GaN layer 104' is in direct contact with the upper electrode 301 made of a conductive transparent oxide or in direct contact with the encapsulation layer 302. By "in direct contact", it should be understood that there is no intermediate layer between the aforementioned layers.

The first stack provided in step a) comprises a base substrate 101 having, for example, a thickness ranging from 250 μm to 2 mm. The thickness depends on the nature of the base substrate 101 and on its dimensions. For example, for a base substrate made of sapphire with a 2-inch diameter, the thickness may be 350 μm. For a support layer made of sapphire with a 6-inch diameter, the thickness may be 1.3 mm. For a support layer made of silicon with a 200-mm diameter, the thickness may be 1 mm.

In the case of a base substrate 101 made of silicon, a buffer layer made of (Al,Ga)N is advantageously interposed between the substrate 101 and the nid-GaN layer 103. It consists of a buffer layer for growth.

The nid-GaN layer 103 is a non-intentionally doped (nid) layer in order not to be porosified. By non-intentionally doped GaN, it should be understood a concentration lower than $5\times10^{17}$ at/cm$^3$. For example, the layer 103 made of nid-GaN has a thickness ranging from 500 nm to 5 μm. Advantageously, its thickness is between 1 and 4 μm to absorb the stresses related to the lattice mismatch between the GaN and the underlying layers.

The strongly n-doped GaN layer 104 is deposited over the nid-GaN layer. By strongly doped GaN, it should be understood a concentration higher than $6\times10^{18}$ at/cm$^3$, preferably at least $8\times10^{18}$ at/cm$^3$, and possibly higher than $10^{19}$ at/cm$^3$. It has a thickness comprised between 100 nm and 500 nm, preferably between 200 nm and 500 nm and even more preferably between 300 nm and 500 nm. This layer allows absorbing the TTVs due to the manufacturing process of the micro-LEDs. This layer is porosified during step d).

The strongly n-doped GaN layer 104 comprises two main faces (an upper face and a lower face) parallel or substantially parallel to one another and a lateral face.

The doped GaN layer 105 is formed over the strongly doped GaN layer 104. By doped GaN, it should be understood a concentration higher than $10^{18}$ at/cm$^3$, preferably between $1\times10^{18}$ at/cm$^3$ and $5\times10^{18}$ at/cm$^3$. For example, the layer made of GaN has a thickness ranging from 100 nm to 1 μm. It must be sufficiently electrically conductive to be able to achieve a resumption of contact on this layer during the electrochemical anodising step. This electrically-conductive layer is electrically connected to the voltage or current generator. Advantageously, the quality of the material of the upper layer is ensured. The minimum thickness varies according to the doping level.

The n-doped GaN layer 105 comprises two main faces (an upper face and a lower face) parallel or substantially parallel to one another and a lateral face.

Next, an n-type doping is described, but it could consist of a p-type doping. The dopings could be inverted.

For example, the quantum wells 106 are GaN/InGaN wells.

For example, the p-doped layer 107 has a thickness comprised between 100 nm and 200 nm. For example, it may have a doping level of $1\times10^{19}\cdot cm^{-3}$ and possibly of at least $1\times10^{20}\cdot cm^{-3}$ in the case of an Mg doping.

The aforementioned different GaN layers as well as the quantum wells 106 are formed by epitaxy.

The first stack 100 may be a more complex stack and may contain, for example, one or more of the following elements: an AlGaN electron-blocking layer (EBL), a multilayer with different dopings to make porous mesas, etc.

During step b), the first stack (p side) is transferred onto a second stack comprising a support substrate 201 and a lower electrode 202 (or first electrode). The first electrode 108 is deposited over the first stack and then the whole is transferred onto the support substrate 201 covered with the metal layer 202.

Preferably, the support substrate 201 is a substrate comprising an ASIC-type integrated circuit, ("Application-Specific Integrated Circuit"). The ASIC circuit may comprise electronic components (transistor(s), capacitor(s), resistors, etc.) enabling the individual control/power supply of each micro-LED according to the colour expected for the pixel. The electronic components are made directly in the volume (or "bulk") of the substrate.

The support substrate 201 may also be an array substrate of thin-film transistors (TFT), in particular to obtain larger direct-view displays.

Preferably, the substrate 201 is a silicon wafer.

The lower electrode 202 (or first electrode) covers the support substrate. It could also be made of ITO. For example, the lower electrode 202 is made of aluminium or silver. For example, it may have a thickness comprised between 40 and 200 nm.

During step c), the base substrate 101, the buffer layer 102 where appropriate, and the nid-GaN layer 103 are removed. For example, the base substrate 101 is removed by laser (also referred to as lift-off technique). The buffer layer 102 and the nid-GaN layer 103 may be removed by thinning. Thinning may be terminated at the nid layer 103/strongly doped GaN layer 104 interface. Preferably, thinning is terminated in the strongly doped GaN layer 104.

During step d), the strongly doped GaN layer 104 is partially or totally porosified. The higher the doping level, the greater the porosification at fixed potential will be. The choice is done according to the targeted optical index.

During step d), the structure and a counter-electrode (CE) are electrically connected to a voltage or current generator. The structure serves as a working electrode (WE). Next, it will be referred to as voltage generator, but it could consist of a current generator allowing applying a current between the device and the counter-electrode.

Contact is achieved on an electrically-conductive layer of the structure, preferably, on the doped GaN layer 105.

The counter-electrode is made of an electrically-conductive material, for example a metal such as platinum.

During step d), the electrodes are immersed in an electrolyte, also called electrolytic bath or electrolytic solution. The electrolyte may be acidic or basic. For example, the electrolyte is oxalic acid. It may also consist of KOH, HF, $HNO_3$, $NaNO_3$, or $H_2SO_4$ or a mixture thereof.

For example, the applied voltage may be comprised between 1 and 30V. Preferably, it is between 5 and 18V (for example between 5 and 15V), and even more preferably between 6 and 12V, for example between 8 and 10V. The voltage is selected according to the doping level of the different layers and the targeted porosity level. For example, it is applied for a duration ranging from a few seconds to several hours. Porosification is complete when there is no longer any current of the imposed potential. At this point, the entire doped structure has been porosified and the electrochemical reaction stops.

The electrochemical anodising step may be carried out under ultraviolet (UV) light.

Upon completion of the porosification step, the porosity level of the porosified GaN layer 104 is at least 10%. Preferably, it ranges from 10% to 80%, and even more preferably from 30% to 70%.

The largest dimension (the height) of the pores may vary from a few nanometres to a few micrometres. The smallest dimension (the diameter) may vary from a few nanometres to a hundred nanometres, in particular from 30 to 70 nm.

The obtained porosification (porosity level and pore size) depends on the doping of the layer and the parameters of the method (voltage applied, duration, nature and concentration of the electrolyte, chemical post-treatment or annealing).

The anodisation of the GaN layer 104 may be total. According to some variants described in more detail later on, the anodisation may be partial. In other words, one or more area(s) 110 of the strongly doped GaN layer are not porosified during step d). Each non-porosified area extends from the first main face to the second main face to form an electrical conduction path through the GaN layer. For example, the electrical conduction path may be in the form of a channel or a tube.

Thus, the electrical conduction is improved by selecting the position of the non-porosified areas. In addition, it is possible to act on the relief.

During step e), the mesas are formed. For example, structuring of the stack is carried out by photolithography.

Mesas, also referred to as elevations, are raised elements. They are obtained, for example, by etching a continuous layer or a plurality of stacked continuous layers, so as to leave only a certain number of "raised portions" of this layer or these layers. Etching is typically a plasma etching (or dry etching) process. The raised portions can be used to define pixels.

Preferably, the sidewalls of the mesas are perpendicular to this stack of layers.

For example, the surface of the mesas may be circular, hexagonal, square or rectangular.

The largest dimension of the surface of the mesas ranges from 500 nm to 500 μm, preferably from 1 to 10 μm and even more preferably from 3 to 5 μm. For example, the largest dimension of a circular surface is the diameter.

The thickness (or depth) of the mesas corresponds to the dimension of the mesa perpendicular to the underlying stack. The depth of the mesas ranges from 0.5 to 1 μm, preferably from 0.3 to 2 μm.

The spacing between two consecutive mesas ranges from 50 nm to 20 μm.

During step f), a second electrode 301 is deposited over the porosified layer 104' (i.e. over the upper face of the porosified layer 104'). The second electrode is a conductive transparent oxide layer. It may consist of an indium-tin oxide layer (ITO), aluminium-doped zinc oxide (AZO), gallium zinc oxide (GZO) or $SnO_2$. This layer covers the mesas. The conductive transparent oxide layer serves as an upper electrode or cathode.

After step f), it is possible to implement a step g) of depositing an encapsulation layer 302 over the conductive transparent oxide layer 301. For example, the encapsulation layer 302 is a layer made of SiN, $SiO_2$ or SiON. It could also consist of a multilayer.

Structuring of the encapsulation layer 302 by microlenses may also be carried out.

It is also possible to deposit an anti-reflector 303 (i.e. an anti-reflective layer) over the encapsulation layer 302 (step h)).

Advantageously, the method comprises between step e) and step f), a step during which a planarising material or stack 304 is deposited between the mesas. The material or the stack may be conductive or insulator. Preferably, it includes copper. For example, the material is deposited by electrochemical deposition (ECD). Advantageously, a step of chemical-mechanical polishing (CMP) of the deposited material 304 is carried out.

We will now describe two variants for which the core of the strongly doped GaN layer of the pixels is not porosified. For example, the core represents 5% to 25% of the volume of the layer.

According to an advantageous variant, shown in FIGS. 2A to 2G, the method comprises the following steps:

a) providing a first stack 100 comprising a base substrate 101, possibly a buffer layer 102 made of AlGaN, a layer 103 made of nid-GaN, a strongly n-doped GaN layer 104, an n-doped GaN layer 105, quantum wells 106 made of Gan/InGaN and a p-doped GaN layer 107 (FIG. 2A), b) transferring the first stack 100 onto a second stack comprising a support substrate 201 covered with a metal layer 202 (FIG. 2B), c) removing the base substrate 101, then removing the buffer layer 102 where appropriate, and the layer 103 made of nid-GaN for example by thinning, whereby a substrate of interest comprising a support substrate 201, the lower electrode 202, the p-doped GaN layer 107, quantum wells 106 made of GaN/InGaN, an n-doped GaN layer 105, a strongly n-doped GaN layer 104 is obtained (FIG. 2C), locally modifying the doping level of the layer 104 to form areas 110 having an electrical conductivity lower than the first electrical conductivity, for example by means of an ion implantation, the GaN n++ layer 104 is thus locally "un-doped" and the areas 110 with a lower conductivity will not be porosified during step d) (FIG. 2D), d) porosifying the strongly n-doped GaN layer 104, whereby a porosified layer 104' is obtained locally comprising areas 110 that are barely or not porosified (FIG. 2E), e) forming mesas in the substrate of interest, by etching the second portion of the doped GaN layer 105, the quantum wells 106, the p-doped GaN layer 107, the lower electrode 202 and a portion of the support substrate 201, the mesas thus comprising the porosified GaN layer 104' locally having non-porosified areas 110, the doped GaN layer 105, the quantum wells 106, the p-doped GaN layer 107, the lower electrode 202 and a portion of the support substrate 201 (FIG. 2F), preferably implementing a step of filling (with a material 304 or a material stack)/planarisation between the mesas, f) covering the mesas by an upper electrode 301 formed by a conductive transparent oxide layer (FIG. 2G), g) possibly, depositing an encapsulation layer 302 over a conductive transparent oxide layer and, advantageously, an anti-reflective layer 303.

For example, the local decrease in the doping level of the strongly doped GaN layer 104 is achieved by implanting helium or hydrogen. The ion implantation step allows reducing the conductivity, deactivating the dopants initially in presence.

After the porosification step, it is possible to carry out a thermal annealing step to increase the conductivity of the area 110.

According to another advantageous variant, shown in FIGS. 3A to 3G, the method comprises the following steps:

a) providing a first stack 100 comprising a base substrate 101, possibly a buffer layer 102 made of AlGaN 102, a nid-GaN layer 103, a strongly n-doped GaN layer 104, an n-doped GaN layer 105, quantum wells 106 made of Gan/InGaN and a p-doped GaN layer 107 (FIG. 3A), b) transferring the first stack 100 onto a second stack comprising a support substrate 201 and a metal layer 202 (FIG. 3B), c) removing the base substrate 101, then, where appropriate, the buffer layer 102 and the GaN nid layer 103, for example by thinning, whereby a substrate of interest comprising a support substrate 201, the upper electrode 202, the p-doped GaN layer 107, quantum wells 106 made of GaN/InGaN, an n-doped GaN layer 105, a strongly doped GaN layer 104 is obtained (FIG. 3C), etching the GaN n++ layer 104 and a portion of the GaN n layer 105 to form "pre-pixels" stopping in a first portion of the n-GaN layer 105, the pre-pixel comprising the GaN n++ layer 104 and a portion of the GaN n layer 105 (FIG. 3D), d) porosifying the periphery of the strongly n-doped GaN layer 104 (the electrochemical porosification starting by the contour of the pixels, the porosification process is stopped before the core is porosified), the non-etched second portion of the n-GaN layer 105 allowing conducting the current for the electrochemical porosification step (FIG. 3E), whereby a partially porosified GaN layer 104' is obtained, e) forming mesas in the substrate of interest starting from the pre-pixels, by etching the second portion of the doped GaN layer 105, the quantum wells 106, the p-doped GaN layer 107, the lower electrode 202 and a portion of the support substrate 201, the mesas thus comprising the strongly doped and partially porosified GaN layer 104', the doped GaN layer 105, the quantum wells 106, the p-doped GaN layer 107, the first electrode 108 and a portion of the support substrate 201 (FIG. 3F), preferably implementing a step of filling (with a material 304 or a material stack)/planarisation between the mesas, f) covering the mesas with an upper electrode 301 formed by a conductive transparent oxide layer, g) possibly, depositing an encapsulation layer 302 over a conductive transparent oxide layer and, advantageously, an anti-reflective layer 303.

We have previously described variants implementing a porosification step after transfer (integration with monolithic bonding of the epitaxy).

We will not describe in more detail a variant where the porosification step is implemented before the transfer step (so-called flip-chip integration).

Figure 4A:
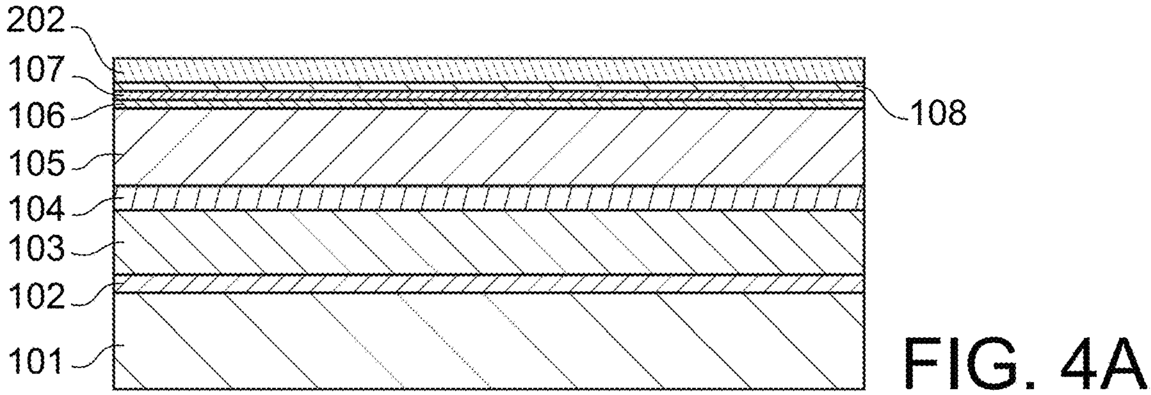
FIGS. 4A to 4J schematically show different steps of a method for manufacturing micro-LEDs according to another particular embodiment of the invention.
Figure 4B:
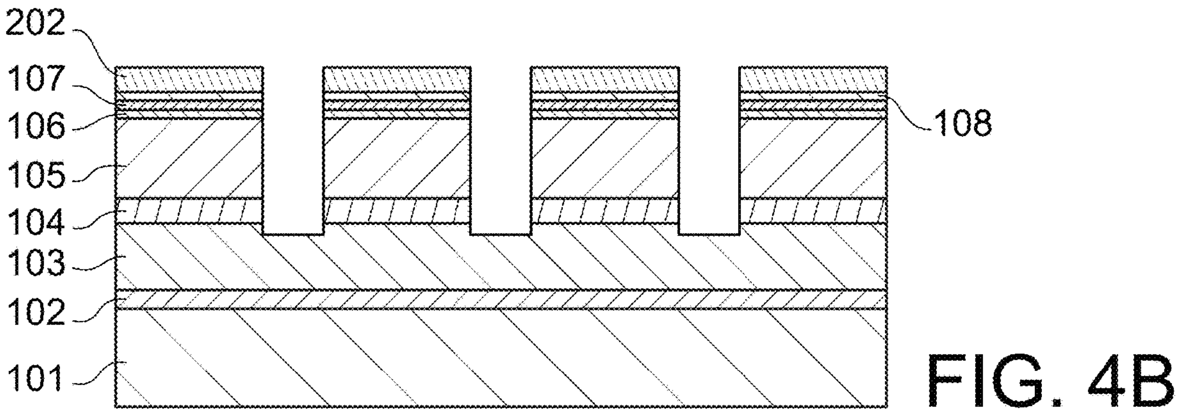
Figure 4C:
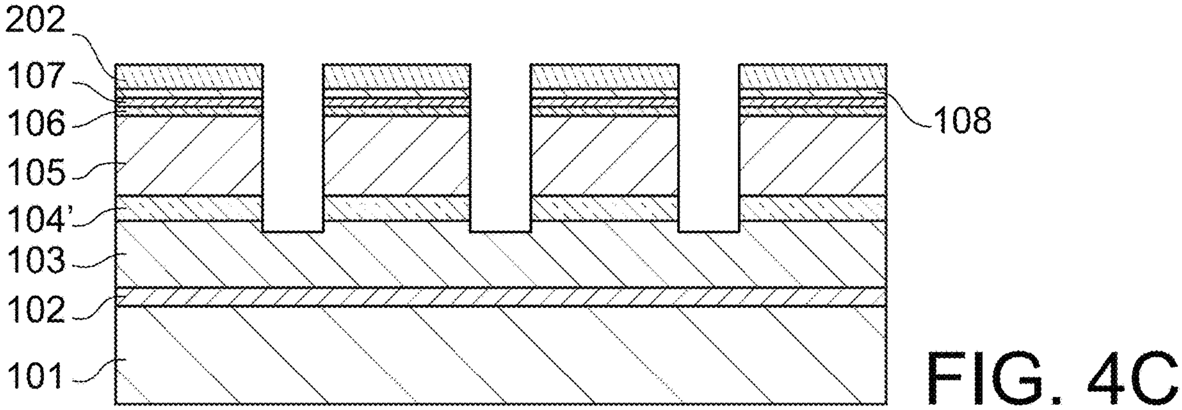
Figure 4D:
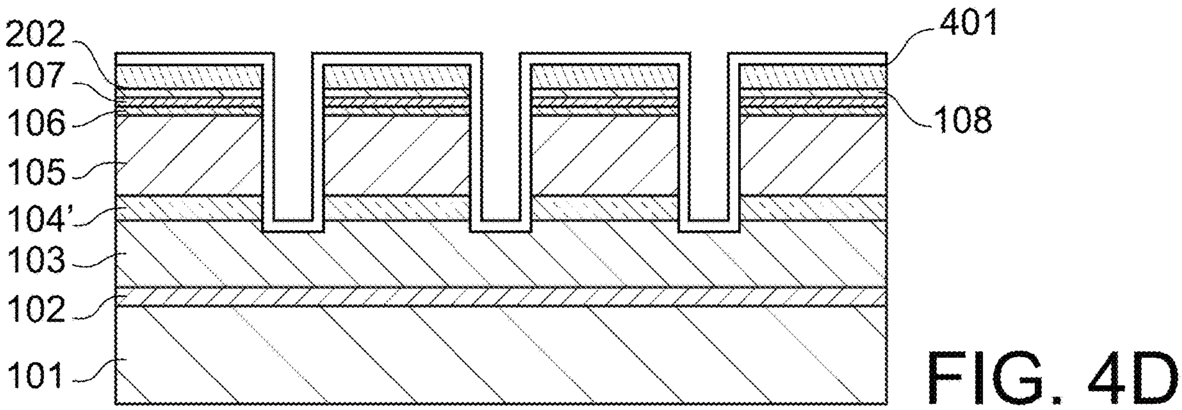
Figure 4E:
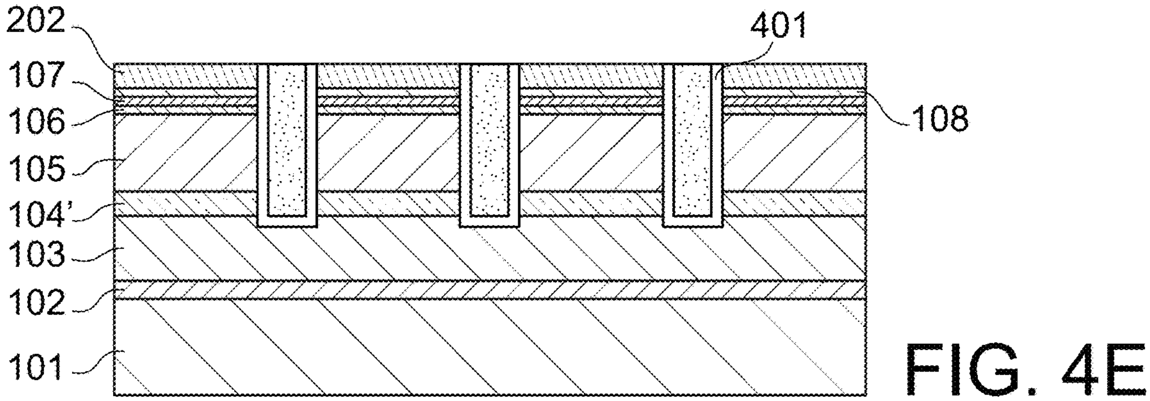
Figure 4F:
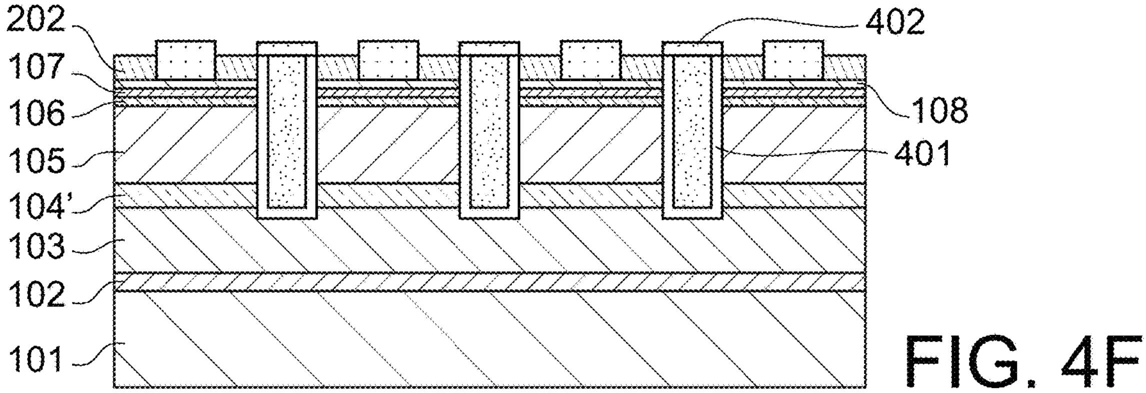
Figure 4G:
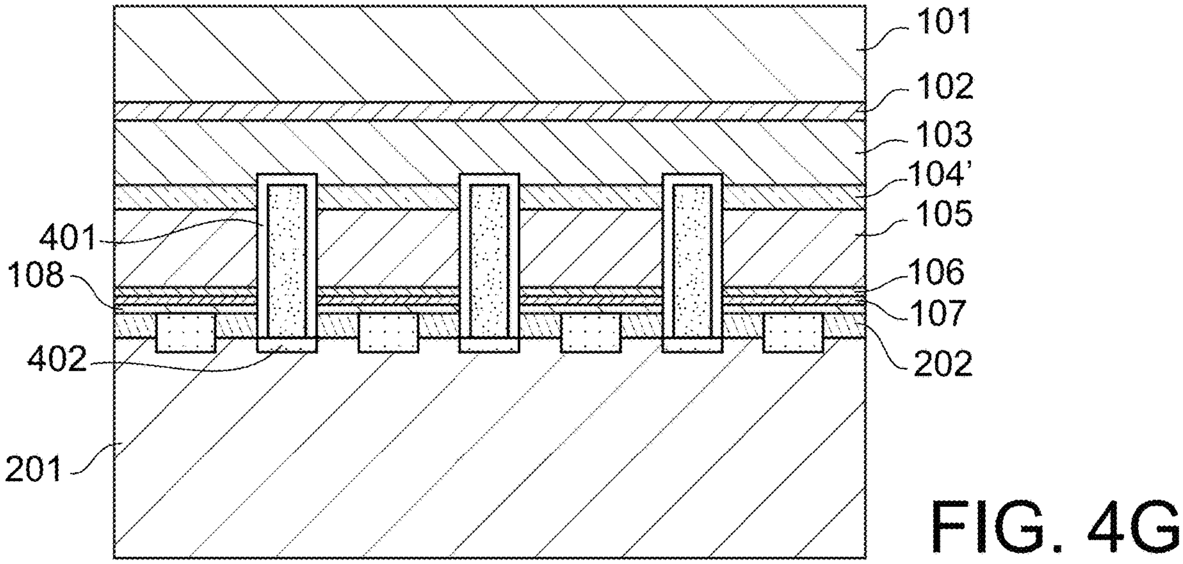
Figure 4H:
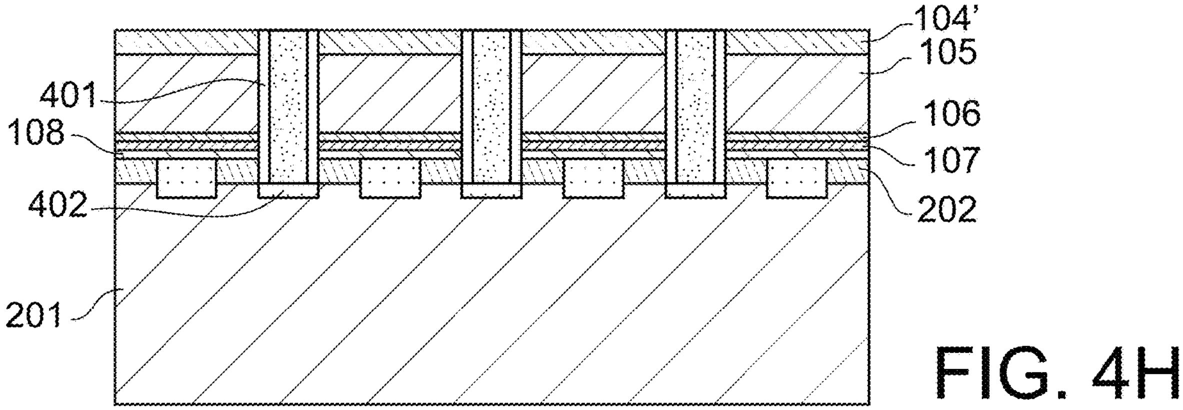
Figure 4I:
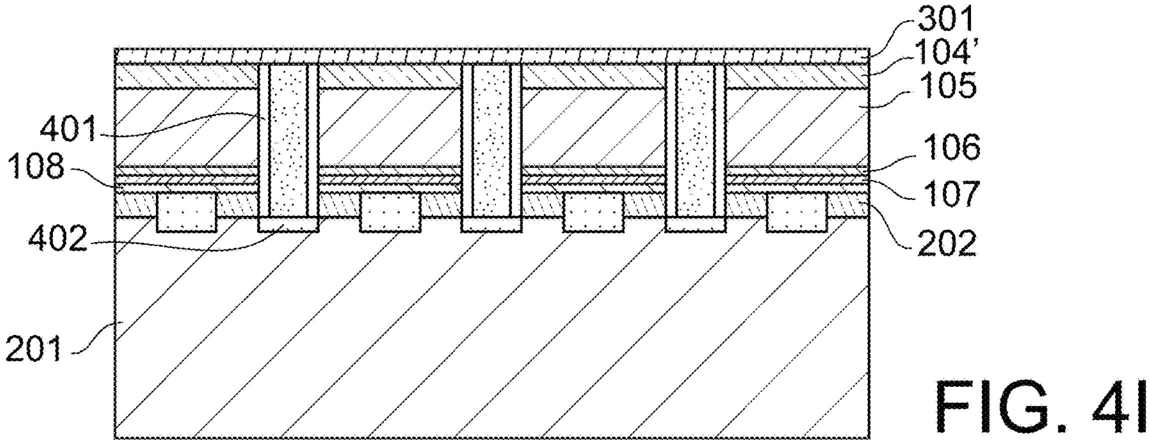
Figure 4J:
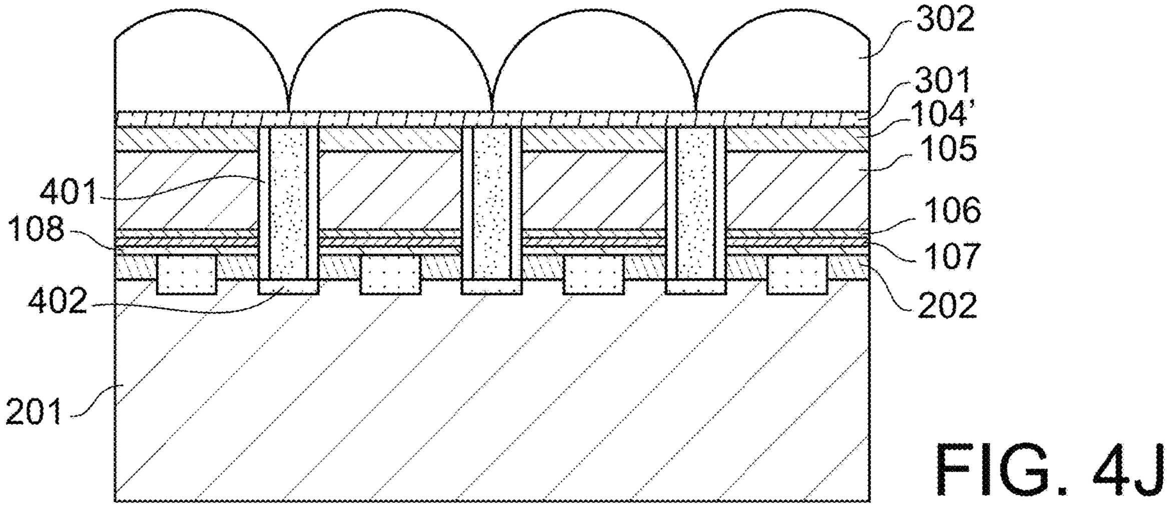

According to this other advantageous variant, shown in FIGS. 4A to 4J, the method may comprise the following steps:

i) providing a stack comprising a support layer 101, a non-intentionally doped GaN layer 103, a strongly n-doped GaN layer 104, an n-doped GaN layer 105, quantum wells 106 and a p-doped GaN layer 107, a first electrode 108 (FIG. 4A), iii) forming mesas in the stack, by etching the first electrode 108, the p-doped GaN layer 107, the quantum wells 106), the n-doped GaN layer 105, the strongly n-doped GaN layer 104 and a portion of the non-intentionally doped GaN layer 103 (FIG. 4B), ii) selectively porosifying the strongly n-doped GaN layer 104, whereby a porosified GaN layer 104' is obtained (FIG. 4C), preferably depositing a passivation dielectric layer 401 (FIG. 4D), etching and planarising the upper surface of the stack to shape the first electrode 108, and preferably fill the inter-mesas space with an electrically-conductive and heat-conductive element (FIG. 4E), preparing metal pads 402 for hybrid bonding or flipping chips ("flip chip") (FIG. 4F), transferring the obtained stack onto a support substrate 201, for example an ASIC-type one, also comprising metal pads (FIG. 4G), removing the support layer 101, the non-intentionally doped GaN layer 103, for example by thinning, whereby a substrate of interest comprising the support substrate 201, the first electrode 108, the p-doped GaN layer 107, the quantum wells 106 made of GaN/InGaN, the n-doped GaN layer 105 and the porosified strongly n-doped GaN layer 104' is obtained (FIG. 4H), iv) covering the porosified GaN layer 104' with a second electrode 301 formed by a conductive transparent oxide layer, preferably an indium-tin oxide layer, the second electrode 301 being in direct contact with the porosified GaN layer 104' (FIG. 4I), depositing an encapsulation layer 302 over the second electrode (FIG. 4J).

The characteristics of the different layers, of the different elements described for this variant where the porosification step is implemented before the transfer step may be identical to the characteristics of the different layers, of the different elements described for the variant where the porosification step is implemented after the transfer step.

The obtained micro-LED structure comprises:

a substrate of interest in which mesas are formed, the substrate of interest comprising a support substrate 201, a lower electrode 202, a p-doped GaN layer 107, quantum wells 106 made of GaN/InGaN, an n-doped GaN layer 105, a totally or partially porosified GaN layer 104', the mesas comprising the porosified GaN layer 104', the doped GaN layer 105, the quantum wells 106, the p-doped GaN layer 107, the lower electrode (or anode) 202 and a portion of the support substrate 201, an upper electrode 301 (or cathode) formed by a conductive transparent oxide layer, preferably an indium-tin oxide layer, covering the mesas, possibly, with an encapsulation layer 302 and an anti-reflective layer 303.

As mentioned before, the GaN layer 104' of the mesas may be totally porosified or partially porosified.

Advantageously, the GaN layer 104' of the mesas comprises a non-porosified central portion 110 and a porosified boundary.

The central portion may be weakly doped or strongly doped.

The approach is particularly interesting:

for structures whose GaN layer is covered and in contact with a transparent electrode then with an encapsulation layer (GaN having an optical index close to that of the transparent electrode)

for structures where the contact of the electrode is a lateral contact and where the GaN layer is covered and in contact with the encapsulation layer (the GaN having an optical index close to that of the encapsulation layer).

In any case, the uniformity of the emission in the encapsulation is found in the air thanks to a structuring that breaks the cavity effect, namely by addition of an anti-reflective layer which enables the light emitted in the encapsulation layer, in particular made of SiN, to pass directly into the air without interacting again with the stack of the structure.

Comparative Examples and Illustrative and Non-Limiting Examples of Different Embodiments

Figure 5A:
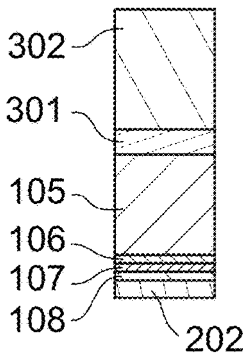
FIG. 5A schematically shows, in section, a micro-LED structure according to a comparative example.

Example 1: Comparative Example with a LED Structure Covered with ITO and SiN In this first illustrative example, the studied LED stack successively comprises (FIG. 5A): an aluminium layer 202, a p-doped layer 107, quantum wells 106, an n-doped GaN layer 105 with an optical index 2.4, a conductive transparent oxide layer 301 made of ITO with an optical index 1.91 and an encapsulation layer 302 made of SiN with an optical index 1.95.

Figure 5B:
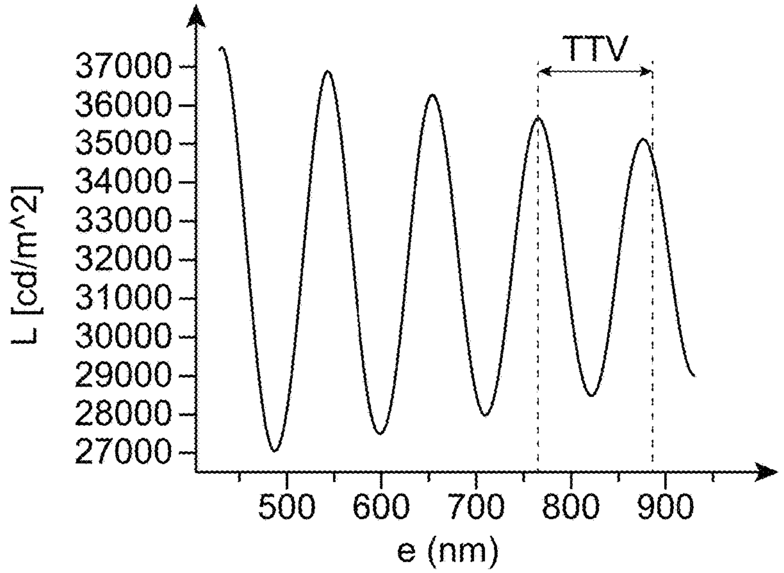
FIG. 5B is a graph representing the luminance of the structure of FIG. 5A as a function of the thickness of the GaN layer.

The simulation of the luminance at 0° (in the axis perpendicular to the plane of the structure) in the SiN according to the n-GaN thickness (FIG. 5B) shows that the luminance very strongly depends on the variations of the GaN thickness.

Figure 6A:
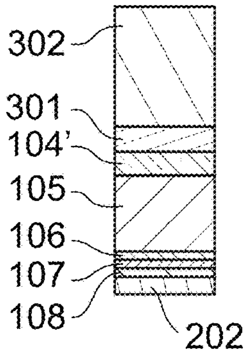
FIG. 6A schematically shows, in section, a micro-LED structure according to a particular embodiment of the invention.

Example 2: Illustrative Example with a LED Structure Covered with ITO and with SiN In this example, the studied LED stack successively comprises (FIG. 6A): an aluminium layer 202, a p-doped layer 107, quantum wells 106, an n-doped GaN layer 105 with an optical index 2.4, a porous GaN layer 104' with an optical index 1.9, a conductive transparent oxide layer 301 made of ITO with an optical index 1.91 and an encapsulation layer 302 made of SiN with an optical index 1.95. In comparison with the previous example, a porous GaN layer has been added. The non-porosified GaN thickness is selected so as to be at a maximum extraction.

Figure 6B:
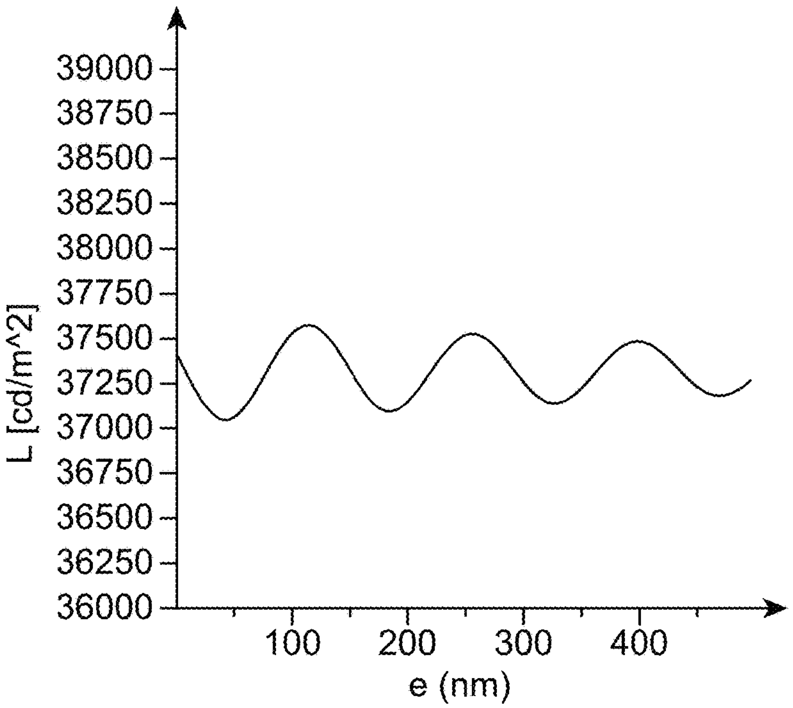
FIG. 6B is a graph representing the luminance of the structure of FIG. 6A as a function of the thickness of the GaN layer.

The simulation of the luminance at 0° in SiN according to the porous GaN thickness (FIG. 6B) confirms that the luminance is much more robust to the GaN thickness variations than with the structure of the comparative example 1 (i.e. almost independent of the porous GaN thickness with a value close to the maximum of the case of Example 1).

Figure 7A:
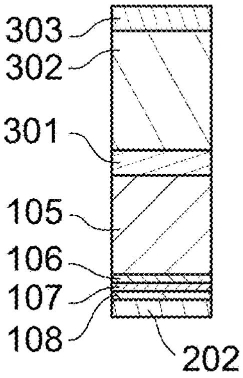
FIG. 7A schematically shows, in section, a micro-LED structure according to another comparative example.

Example 3: Comparative Example with a LED Structure Covered with ITO, SiN and $SiO_2$ In this first illustrative example, the studied LED stack successively comprises (FIG. 7A): an aluminium layer 202, a p-doped layer 107, quantum wells 106, an n-doped GaN layer 105 with an optical index 2.4, a conductive transparent oxide layer 301 made of ITO with an optical index 1.91, an encapsulation layer 302 made of SiN with an optical index 1.95, an anti-reflective layer 303 made of $SiO_2$.

Figure 7B:
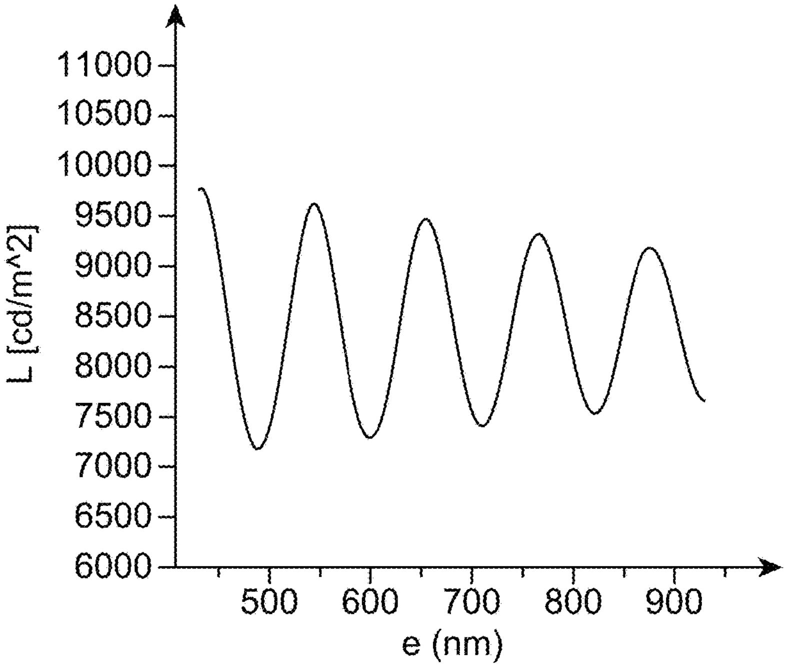
FIG. 7B is a graph representing the luminance of the structure of FIG. 7A as a function of the thickness of the GaN layer.

The simulation of the luminance at 0° in air, located above the layer 303, according to the n-GaN thickness (FIG. 7B) shows that the luminance depends very strongly on the variations of the GaN thickness.

Figure 8A:
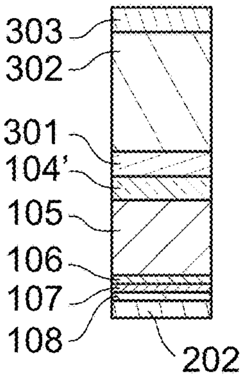
FIG. 8A schematically shows, in section, a micro-LED structure according to another particular embodiment of the invention.

Example 4: Illustrative Example with a LED Structure Covered with ITO, SiN and $SiO_2$ In this example, the studied LED stack successively comprises (FIG. 8A): an aluminium layer 202, a p-doped layer 107, quantum wells 106, an n-doped GaN layer 105 with an optical index 2.4, a porous GaN layer 104' with an optical index 1.9, a conductive transparent oxide layer 301 made of ITO with an optical index 1.91, an encapsulation layer 302 made of SiN with an optical index 1.95, an anti-reflective layer 303 made of $SiO_2$.

The non-porosified GaN thickness is selected so as to be at a maximum extraction.

Figure 8B:
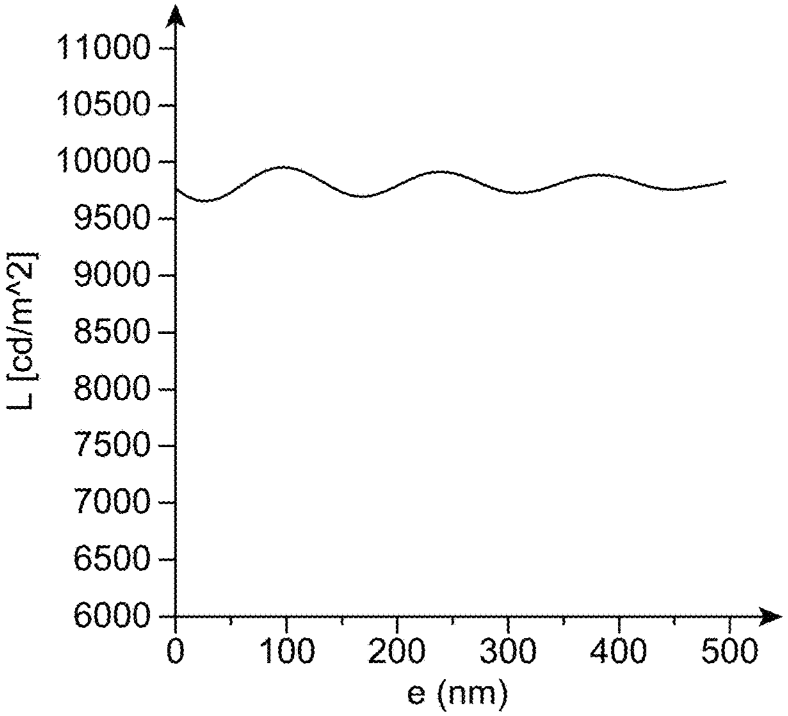
FIG. 8B is a graph representing the luminance of the structure of FIG. 8A as a function of the thickness of the GaN layer.

The simulation of the luminance at 0° in the air, located above the layer 303, according to the porous GaN thickness (FIG. 8B) confirms that the luminance is much more robust to GaN thickness variations than with the structure of the comparative example 3, i.e. almost independent of the porous GaN thickness.

Figure 9:
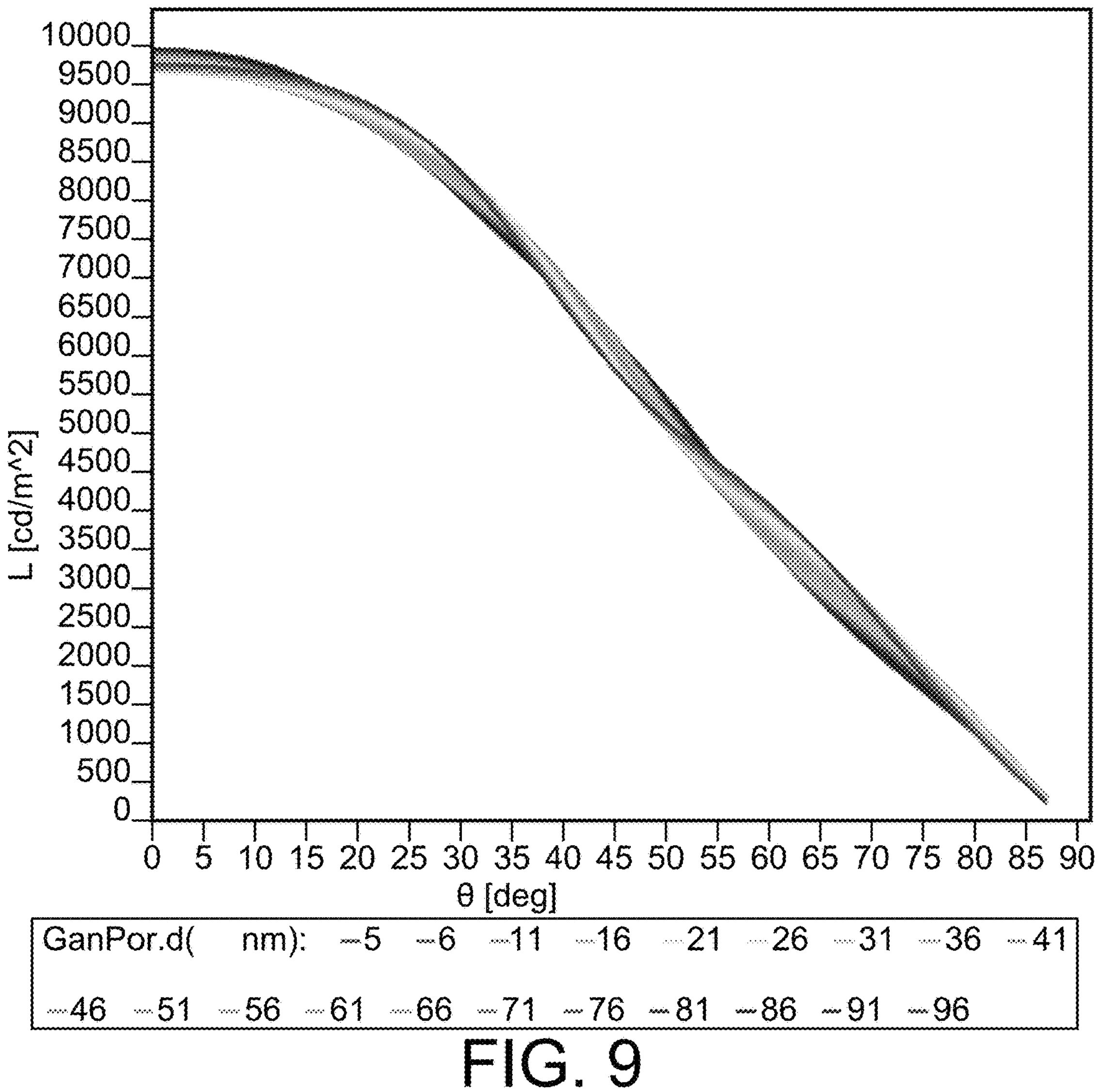
FIG. 9 is a graph representing the luminance as a function of the emission angle, according to a particular embodiment of the invention.

In addition, the simulation of the luminance in air according to the observation angle for different porous GaN thicknesses (FIG. 9) shows that the luminance in air is barely affected by the porous GaN thickness even at angles different from 0°.

Figure 10:
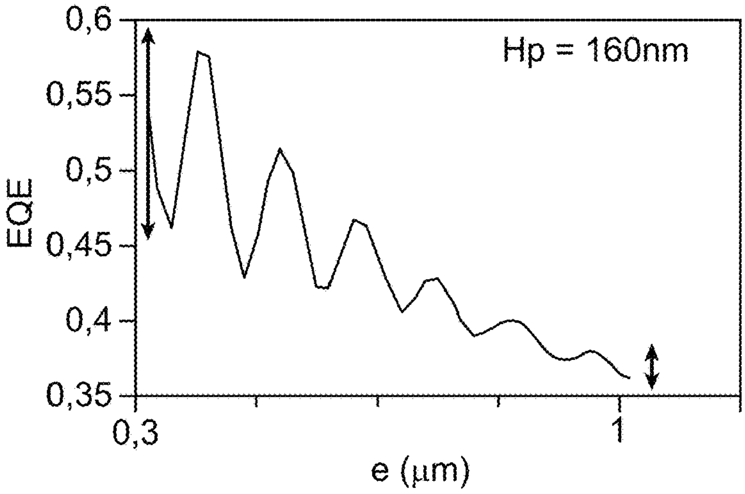
FIG. 10 is a graph representing the EQE according to the total thickness of GaN.

The 2D simulation of the external quantum efficiency or EQE (in air) of a micro-LED having mesas with a size of about 1 μm according to the GaN thickness has also been studied (FIG. 10). The micro-LED is not covered with an encapsulation layer. It should be noted that this simulation represents the overall EQA (between 0 and 90°).

It is interesting to note that the smaller the GaN thicknesses, the higher the EQE will be and the greater the oscillations according to the GaN thickness will be. The oscillation effects might be even greater as the angular space will be reduced, for example if the considered emission is between 0 and 18.5° in the axis perpendicular to the plane of the structure.

The invention claimed is:

1. A method for manufacturing micro-LEDs, the method comprising:

(i) providing a stack comprising a strongly n-doped GaN layer, an n-doped GaN layer, quantum wells, a p-doped GaN layer, and a first electrode;

(ii) porosifying the strongly n-doped GaN layer, to obtain a porosified GaN layer;

(iii) forming mesas in the stack;

(iv) covering the porosified GaN layer with a second electrode formed by a conductive transparent oxide layer, the second electrode being in direct contact with the porosified GaN layer, then, optionally, covering the second electrode with an encapsulation layer;

or depositing a second electrode over a lateral face of the porosified GaN layer or over a lateral face of the n-doped GaN layer and covering the porosified GaN layer with the encapsulation layer, the encapsulation layer being in direct contact with the porosified GaN layer, wherein the porosifying (ii) is carried out before or after the forming (iii), wherein the porosifying (ii) step ii) being is carried out so that a $GaN_p$ optical index of the porosified GaN layer, which is $n_{eff}$, does not vary by more than 10% with respect to an E2 optical index of the second electrode and/or with respect to an EL optical index of the encapsulation layer.

2. The method of claim 1, wherein the conductive transparent oxide layer is an indium-tin oxide layer.

3. The method of claim 2, wherein the encapsulation layer comprises SiN, $SiO_2$ or SiON.

4. The method of claim 1, wherein a pore volumetric concentration in the porosified GaN layer is determined based on the following a formula:

$$n_{eff} = \sqrt{(1-p).n_{GaN}^2 + p.n_{air}^2}\,.$$

wherein p is the pore volumetric concentration, $n_{GaN}$ is an optical index of GaN, and $n_{air}$ an optical index of air.

5. The method of claim 1, wherein the covering (iii) of the porosified GaN layer with the second electrode comprises covering the second electrode with an encapsulation layer.

6. The method of claim 1, wherein the encapsulation layer comprises SiN, $SiO_2$ or SiON.

7. The method of claim 1, comprising the covering (iii).

8. The method of claim 1, comprising the depositing (iv).

9. A method for manufacturing micro-LEDs, the method comprising:

(a) providing an initial stack comprising a support layer, a non-intentionally doped GaN layer, a strongly n-doped GaN layer, an n-doped GaN layer, the quantum wells, a p-doped GaN layer, and a first electrode;

(b) transferring the initial stack onto a support substrate covered with a metal layer;

(c) removing the support layer, and optionally buffer layer comprising (Al,Ga)N, the non-intentionally doped GaN layer, to obtain a substrate of interest comprising the support substrate, the first electrode, the p-doped GaN layer, the GaN/InGaN quantum wells, the n-doped GaN layer and the strongly n-doped GaN layer;

(ii) forming mesas in the stack; and (iii) covering the porosified GaN layer with a second electrode formed by a conductive transparent oxide layer, the second electrode being in direct contact with the porosified GaN layer;

or depositing a second electrode over a lateral face of the porosified GaN layer or over a lateral face of the n-doped GaN layer and covering the porosified GaN layer with an encapsulation layer, the encapsulation layer being in direct contact with the porosified GaN layer, wherein the porosifying (ii) is optionally carried out before or after the forming (iii), wherein the porosifying is (ii) carried out so that a $GaN_p$ optical index of the porosified GaN layer, which is $n_{eff}$, does not vary by more than 10% with respect to an E2 optical index of the second electrode and/or with respect to an EL optical index of the encapsulation layer.

10. The method of claim 9, further comprising, before the porosifying (ii):

locally reducing a doping level of the strongly n-doped GaN layer, so as to obtain a first portion of the strongly n-doped GaN layer having a first electrical conductivity and a second portion having a second electrical conductivity, the first electrical conductivity being higher by at least a factor of ten than the second electrical conductivity, wherein the second portion is not porosified during the porosifying (ii), and wherein the porosified GaN layer of the mesas obtained in the covering (iii) comprises a non-porosified portion and a porosified portion.

11. The method of claim 10, wherein the locally reducing comprises implanting helium or hydrogen ions.

12. The method of claim 10, wherein the non-porosified portion is at a center of the porosified portion.

13. The method of claim 9, further comprising, between the providing (i) and the porosifying (ii):

etching the strongly n-doped GaN layer and a portion of the n-doped GaN layer are etched to form a pre-structure of mesas.

14. The method of claim 9, wherein, in the providing (a), the initial stack further comprises a buffer layer comprising (Al,Ga)N.

15. The method of claim 9, wherein the removing (c) comprises thinning.

16. The method of claim 9, wherein, during the porosifying (ii), a central portion of the strongly n-doped GaN layer is not porosified, wherein the GaN layer of the mesas obtained in the forming (iii) comprises a non-porosified central portion and a porosified boundary.

17. The method of claim 16, further comprising:
stopping the porosifying (ii) before totally porosification of the strongly doped GaN layer, such that the central portion of the strongly n-doped GaN layer is not porosified.

18. The method of claim 9, wherein the forming (iii) comprises etching a further portion of the n-doped GaN layer, the quantum wells, the p-doped GaN layer, the first electrode, and a portion of the support substrate.

19. A method for manufacturing micro-LEDs, the method comprising:
providing a stack comprising a support layer, a non-intentionally doped GaN layer, a strongly n-doped GaN layer, an n-doped GaN layer, quantum wells, a p-doped GaN layer, and a first electrode;
forming mesas in the stack, by etching the first electrode, the p-doped GaN layer, the quantum wells, the n-doped GaN layer, the strongly n-doped GaN layer; and a portion of the non-intentionally doped GaN layer;
porosifying the strongly n-doped GaN layer, to obtain whereby a porosified GaN layer in an obtained stack;
transferring the obtained stack onto a support substrate covered with a metal layer;
removing the support layer, the non-intentionally doped GaN layer, to obtain a substrate of interest comprising the support substrate, the first electrode, the p-doped GaN layer, GaN/InGaN quantum wells, the n-doped GaN layer, and the strongly n-doped GaN layer; and
covering the porosified GaN layer with a second electrode formed by a conductive transparent oxide layer, the second electrode being in direct contact with the porosified GaN layer;
or
depositing a second electrode over a lateral face of the porosified GaN layer or over a lateral face of the n-doped GaN layer and covering the porosified GaN layer with an encapsulation layer, the encapsulation layer being in direct contact with the porosified GaN layer,
wherein the porosifying is carried out before or after the forming,
wherein the porosifying is carried out so that a $GaN_p$ optical index of the porosified GaN layer, which is $n_{eff}$, does not vary by more than 10% with respect to an E2 optical index of the second electrode and/or with respect to an EL optical index of the encapsulation layer.

20. A micro-LED structure, comprising:
a stack comprising a porosified strongly n-doped GaN layer, an n-doped GaN layer, quantum wells, a p-doped GaN layer, a first electrode, mesas being formed in the stack,
wherein the porosified GaN layer is covered by and in direct contact with a second electrode, formed by a conductive transparent oxide layer, the second electrode being optionally covered with an encapsulation layer,
or
wherein a second electrode is arranged over a lateral face of the porosified GaN layer or over a lateral face of the n-doped GaN layer, the porosified GaN layer being covered by and in direct contact with an encapsulation layer,
wherein a $GaN_p$ optical index of the porosified GaN layer does not vary by more than 10% with respect to an E2 optical index of the second electrode and/or with respect to an EL optical index of the encapsulation layer.

21. The structure of claim 20, wherein the porosified GaN layer of the mesas comprises a non-porosified central portion and a porosified boundary.

22. The structure of claim 21, wherein the central portion is weakly doped.

23. The structure of claim 21, wherein the central portion is strongly doped.

24. The structure according to of claim 20, wherein the porosified GaN layer has a thickness in a range of from 100 to 500 nm.

25. The structure of claim 20, wherein the porosified GaN layer has a thickness in a range of from 300 to 500 nm.

* * * * *